(12) United States Patent
Saito et al.

(10) Patent No.: US 6,471,094 B2
(45) Date of Patent: Oct. 29, 2002

(54) ELECTRONIC COMPONENT FEEDING APPARATUS

(75) Inventors: Koji Saito; Atsuo Kamimura; Satoshi Tsuchiya, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/873,414

(22) Filed: Jun. 5, 2001

(65) Prior Publication Data

US 2002/0046922 A1 Apr. 25, 2002

(30) Foreign Application Priority Data

Jun. 5, 2000 (JP) .......................... 2000-167332

(51) Int. Cl.⁷ .............................. B65G 59/00
(52) U.S. Cl. ........................ 221/278; 221/210
(58) Field of Search .................. 221/210, 211, 221/212, 278

(56) References Cited

U.S. PATENT DOCUMENTS

| | | | | |
|---|---|---|---|---|
| 5,368,193 A | * | 11/1994 | Takahashi et al. | 221/278 |
| 6,041,964 A | * | 3/2000 | Tokarz et al. | 221/211 |
| 6,283,325 B1 | * | 9/2001 | Saito et al. | 221/200 |
| 6,296,104 B1 | * | 10/2001 | Ito et al. | 221/212 |
| 6,308,861 B1 | * | 10/2001 | Saito et al. | 221/212 |

FOREIGN PATENT DOCUMENTS

| | | |
|---|---|---|
| JP | 63-6932 | 1/1988 |
| JP | 05-247882 | 10/1993 |

OTHER PUBLICATIONS

Patent Abstract of Japan: Publication No.: JP1183200A2, Jul. 1989."Device for Supplying Chip Component", Patent application No.: 63–6932, Jan. 1988. http://www.delphion.com/details?&pn=JP01163200A2.
Patent Abstract of Japan: Publication No.: JP6232596A2, Aug. 1994."Chip Component Supplier", Patent application No.: 05-247882, Oct. 1993. http://www.delphion.com/details?& pn=JP06232596A2.

* cited by examiner

Primary Examiner—H. Grant Skaggs
(74) Attorney, Agent, or Firm—Lowe Hauptman Gilman & Berner, LLP

(57) ABSTRACT

An electronic component feeding apparatus which conveys electronic components in a ranging condition and feeds a foremost electronic component to a component taking-out position. This apparatus includes a component conveying passage, a shutter for opening and closing a component outlet port of the component passage, a component stopper including an air suction path which leads to the component outlet port, a shutter for opening and closing the component outlet port, an air suction unit having an air suction port, an air tube for communicating an air suction force from the air suction port to the air suction path, and a lever mechanism for operating the shutter and the air suction unit.

8 Claims, 26 Drawing Sheets

ELECTRONIC COMPONENT FEEDING APPARATUS

BACKGROUND OF THE INVENTION (1) Field of the Invention

The present invention relates to an electronic component feeding apparatus for conveying electronic components such as chip components in a ranging condition and feeding a foremost electronic component to a component taking-out position.

(2) Description of the Related Art

This kind of an electronic component feeding apparatus has been disclosed in a Japanese Patent Application Laid-Open No. H6-232596. The apparatus disclosed in the application has functions to discharge chip components contained in a bulk state in a storeroom onto a belt through a component conveying pipe, to convey the discharged chip components by use of a belt, and to stop the conveyed chip components at a predetermined component taking-out position by use of a stopper.

In the above-described apparatus, since the belt is used in order to convey chip components forward, a mechanism for moving the belt, for example, a ratchet mechanism for intermittently moving the belt becomes separately necessary. Recently, a reduction in cost has been requested for this kind of apparatus, but in the above-described apparatus requiring the belt and its moving mechanism in order to convey components, there is naturally a limit to reduce the apparatus cost. Apart from the above-described apparatus, there has been known an apparatus utilizing air suction for conveying the chip components forward, but since a large-sized suction source such as a vacuum pump will be separately required, and air piping from the suction source will become complicated, this is not suitable to reduce the apparatus cost.

SUMMARY OF THE INVENTION

An object of the present invention is to provide a low-priced electronic component feeding apparatus simple in structure, capable of precisely feeding electronic components.

In order to attain the above-described object, the present invention comprises: a component passage for conveying electronic components in a ranging condition, said component passage having a component outlet port; a shutter for opening and closing the component outlet port of the component passage; a component stopper for stopping an advancement of the electronic components, said component stopper including an air suction path which leads to the component outlet port of the component passage; an air suction unit having an air suction port; an air tube for communicating an air suction force from the air suction port of the air suction unit to the air suction path of the component stopper; and a lever mechanism for operating the shutter and the air suction unit so that the air suction force acts in the air suction path of the component stopper through the air tube when the component outlet port of the component passage is closed by the shutter, and no air suction force acts in the air suction path of the component stopper through the air tube when the component outlet port of the component passage is opened by the shutter.

According to this electronic component feeding apparatus, the air suction force generated in the air suction unit is caused to act on the component outlet port of the component passage through the air tube and the air suction path of the component stopper, whereby it is possible to cause a flow of air toward the component stopper within the component passage through the use of this air suction force, to convey the electronic components within the component passage in the ranging condition by means of this flow of air, and to cause the foremost electronic component to abut on the component stopper. Therefore, such the belt and its moving mechanism, the large-sized suction source such as the vacuum pump, the air piping from this suction source and so on in the conventional case are not required in order to convey the electronic components.

Also, the air suction force acts in the air suction path of the component stopper through the air tube when the component outlet port of the component passage is closed by the shutter, and no air suction force acts in the air suction path of the component stopper through the air tube when the component outlet port of the component passage is opened by the shutter, whereby conveyance of components by air suction can be precisely executed.

The foregoing and other objects of the present invention, structural features, and operational effect will be apparent from the following description and the accompanying drawings.

DESCRIPTION OF THE PREFERRED EMBODIMENTS

First Embodiment

Figure 1:
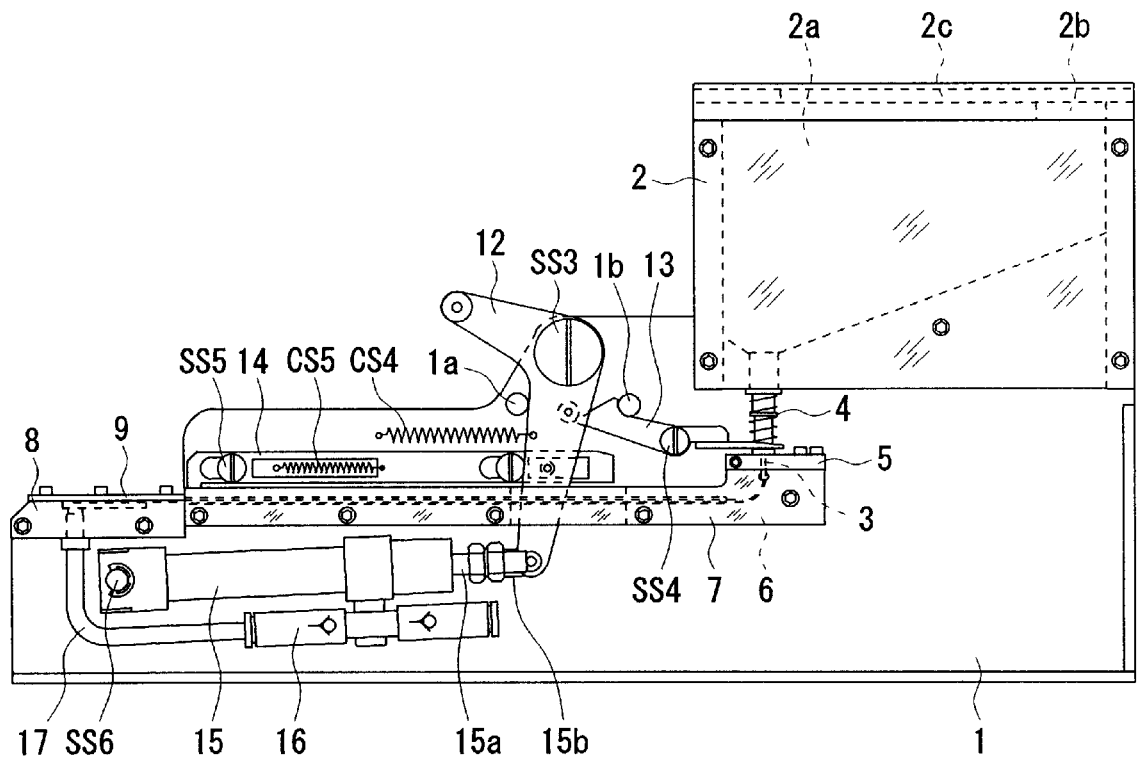
FIG. 1 is a left side view showing an electronic component feeding apparatus according to a first embodiment of the present invention.
Figure 2:
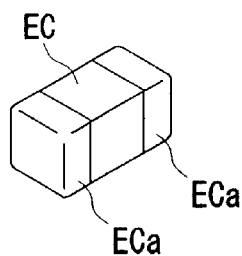
FIGS. 2A and 2B are perspective views each showing an example of a shape of an electronic component applicable to the apparatus shown in FIG. 1.
Figure 2:
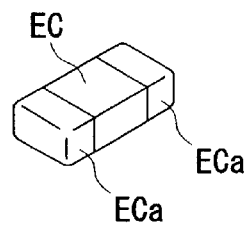

FIGS. 1 to 22 show a first embodiment according to the present invention, and in the following description, the left side of FIG. 1 is indicated as front, the right, as behind, this side, as left, and the inside, as right.

Figure 3:
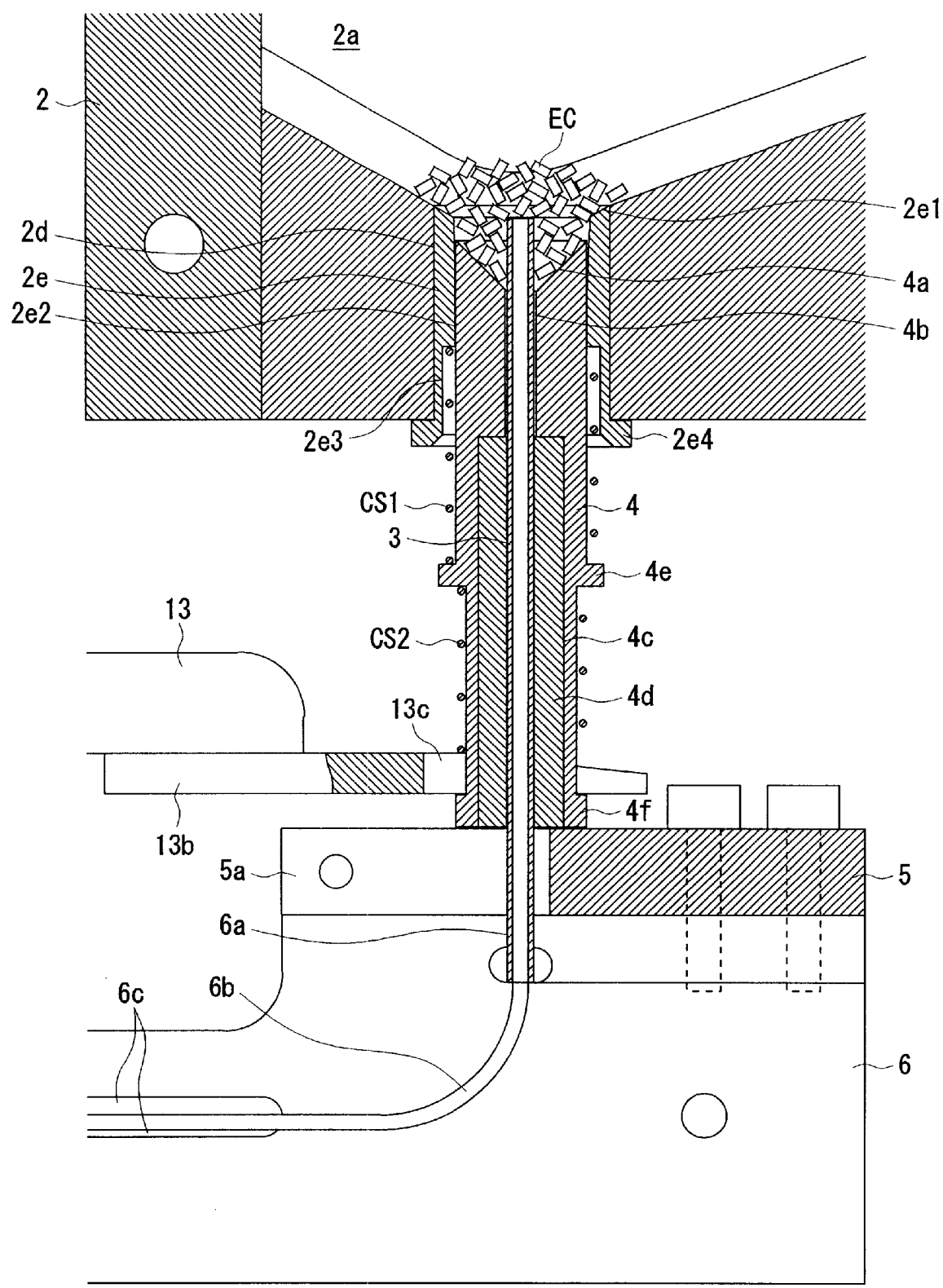
FIG. 3 is a partially-enlarged longitudinal sectional view showing the apparatus shown in FIG. 1.
Figure 4:
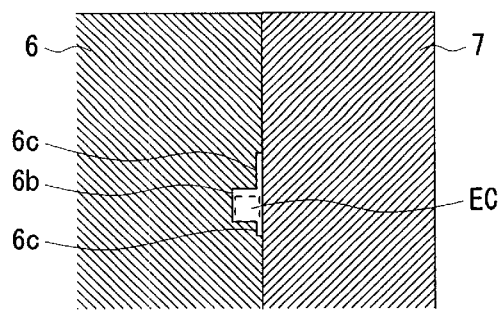
FIG. 4 is a partially-enlarged longitudinal sectional view showing a component passage of a first component guide portion of the apparatus shown in FIG. 1.
Figure 5:
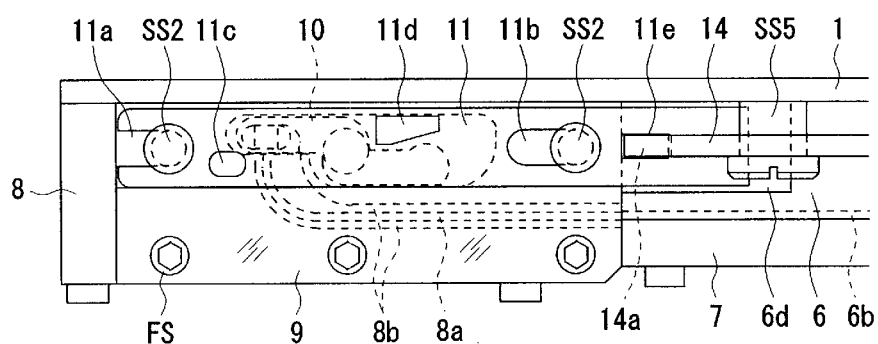
FIG. 5 is a partially-enlarged top view showing the apparatus shown in FIG. 1.
Figure 6:
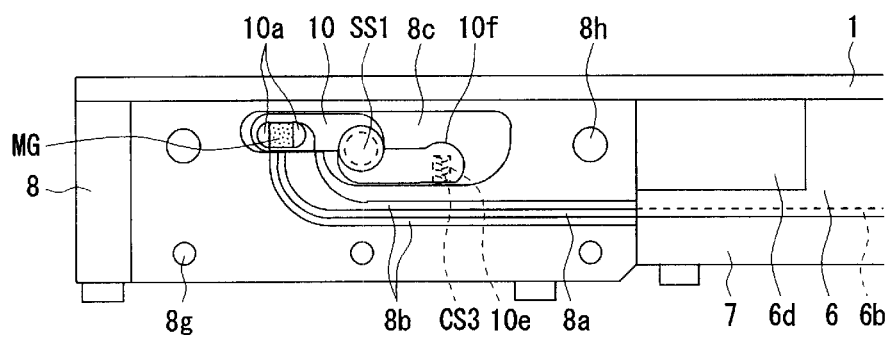
FIG. 6 is a view obtained by excluding a shutter and a supporting shaft from FIG. 5.
Figure 7:
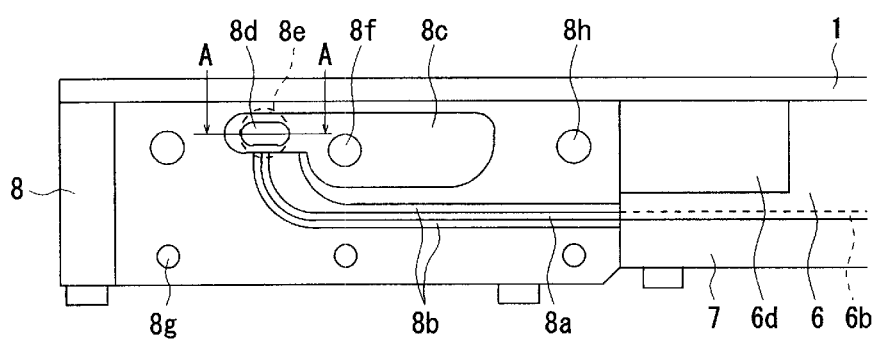
FIG. 7 is a view obtained by excluding a component stopper and the supporting shaft from FIG. 6.
Figure 8:
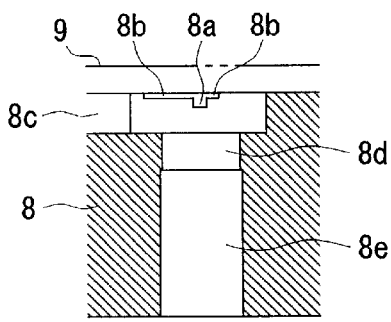
FIG. 8 is a sectional view taken on a line A—A of FIG. 7.
Figure 9:
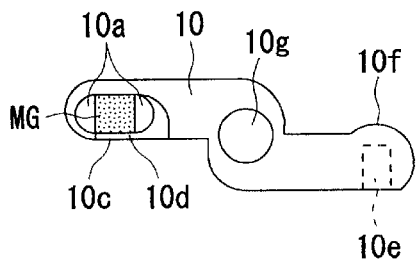
FIGS. 9A to 9D are a top view, a left side view, a partially-exploded left side view and a partially-exploded front view showing the component stopper respectively.
Figure 9:
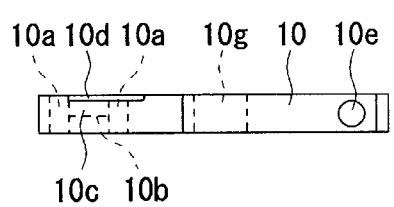
Figure 9:
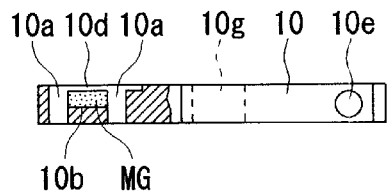
Figure 9:
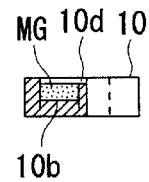
Figure 10:
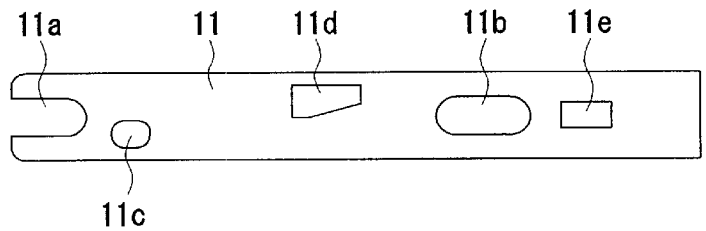
FIGS. 10A and 10B are a top view and a left side view showing the shutter respectively.
Figure 10:
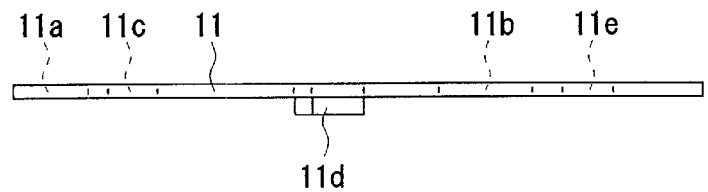
Figure 11:
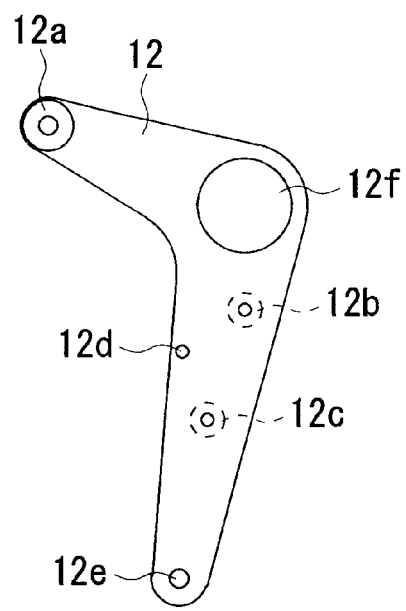
FIG. 11 is a left side view showing an operating lever.
Figure 12:
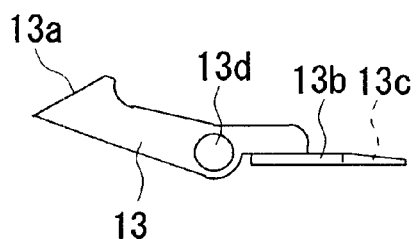
FIG. 12 is a left side view showing a driving lever.
Figure 13:
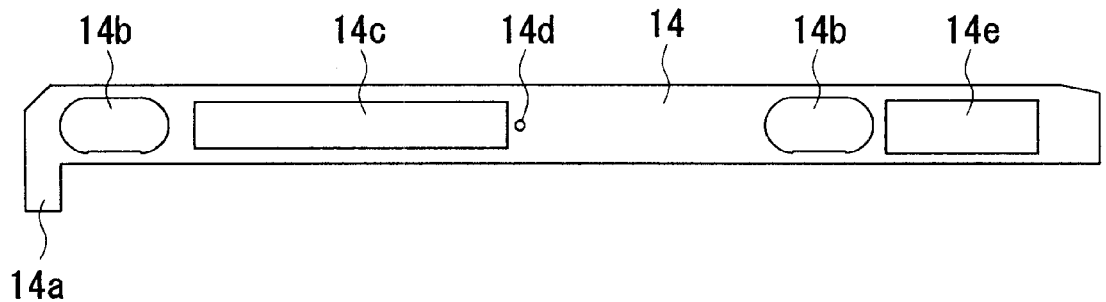
FIG. 13 is a left side view showing a driving plate.

FIG. 1 is a left side view showing an electronic component feeding apparatus, FIG. 2A and 2B are perspective views each showing an example of a shape of an electronic component applicable to the apparatus shown in FIG. 1, FIG. 3 is a partially-enlarged longitudinal sectional view showing the apparatus shown in FIG. 1, FIG. 4 is a partially-enlarged longitudinal sectional view showing a component passage of a first component guide portion of the apparatus shown in FIG. 1, FIG. 5 is a partially-enlarged top view showing the apparatus shown in FIG. 1, FIG. 6 is a view obtained by excluding a shutter and a supporting shaft from FIG. 5, FIG. 7 is a view obtained by excluding a component stopper and the supporting shaft from FIG. 6, FIG. 8 is a sectional view taken on a line A—A of FIG. 7, FIGS. 9A to 9D are a top view, a left side view, a partially-exploded left side view and a partially-exploded front view showing the component stopper respectively, FIGS. 10A and 10B are a top view and a left side view showing the shutter respectively, FIG. 11 is a left side view showing an operating lever, FIG. 12 is a left side view showing a driving lever, FIG. 13 is a left side view showing a driving plate, and FIGS. 14 to 22 are explanatory views illustrating an operation of the apparatus shown in FIG. 1.

In those drawings, reference numeral 1 denotes a frame; 2, a storage unit, 3, a fixed pipe; 4, a movable pipe; 5, a pipe holder; 6, a first component guide; 7, a first cover for the first component guide; 8, a second component guide; 9, a second cover for the second component guide; 10, a component stopper; 11, a shutter; 12, an operating lever; 13, a driving lever; 14, a driving plate; 15, an air cylinder; 16, a control valve; and 17, an air tube.

The frame 1 is formed by shaping a plate material obtained by stamping a metallic plate of stainless steel or the like in a predetermined shape, by performing flex or the like. In the frame 1 shown in the drawing, the lower end edge and the rear end edge are provided with a bent portion for improving the frame stiffness, but these bent portions are not always required. On the left side surface of the frame 1, there are provided a first stopper 1a for stipulating a return position of the operating lever 12, and a second stopper 1b for stipulating a return position of the driving lever 13.

The storage unit 2 has a storeroom 2a having a smaller dimension along the lateral direction than a dimension along the back-and-forth direction, and having a substantially V-character-shaped inclined bottom surface. On the top of the storage unit 2, there are provided a replenish port 2b for replenishing components into the storeroom 2a, and a slide cover 2c for opening or closing this replenish port 2b. Also, at the deepest recess of the storeroom 2a, there is formed a circular port 2d so as to penetrate, and a substantially-cylindrical bushing 2e is fitted in this circular hole 2d. The bushing 2e has a cone-shaped guide surface 2e1 at the top end, has, at the center, an inner hole 2e2 having a slightly smaller circular cross section than an upper outside diameter of the movable pipe 4, and has an annular concave portion 2e3 for housing an upper part of a first coiled spring CS1, and a collar 2e4 for stipulating a fitting-in position on the circular hole 2d at the lower part. In the storage unit 2, at least the left side portion is constructed by a transparent part in such a manner that a quantity of stored components can be confirmed from outside. Also, the storage unit 2 is detachably mounted to the frame 1 by means of setscrews.

Within the storeroom 2a, a multiplicity of electronic components EC having such a square pillar shape as shown in FIG. 2A are housed in a bulk state. This electronic component EC is chip component such as, for example, chip condenser, chip inductor and chip resistor, and have external electrodes ECa at both ends in the lengthwise direction. The electronic component EC shown in FIG. 2A has dimensional relationship of length>width=height, and it is also possible to handle the electronic component EC having such dimensional relationship of length>width>height as shown in FIG. 2B.

The fixed pipe 3 is constructed by circular pipe material of predetermined length made of metal, hard resin or the like, and has an inner hole having a circular cross section at the center. The shape of the cross section of the inner hole in the fixed pipe 3 is slightly larger than length of a diagonal line of the end surface of the electronic component EC so that the electronic component EC can be caused to fall down by gravity in the lengthwise direction. This fixed pipe 3 is inserted at its lower end portion into a pipe mounting hole of the first component guide 6 through a pinching slit 5a of the pipe holder 5. The pipe holder 5 is secured to the first component guide 6 by screws, and a clearance in the pinching slit 5a is narrowed by a screwing operation, whereby the fixed pipe 3 can be held. The upper end of the fixed pipe 3 is at a slightly lower position than the upper end of the bushing 2e, but may be at a position which coincides with the upper end of the bushing 2e, or at a slightly higher position than the upper end thereof.

The movable pipe 4 portion other than the bushing 4d is made of metal, hard resin or the like, and the movable pipe 4 has a cone-shaped guide surface 4a at the top end, and has, at the center, an inner hole 4b having a slightly larger circular cross section than the outside diameter of the fixed pipe 3. Also, inside the lower part of the movable pipe 4, there is formed a bushing mounting hole 4c, and in this hole 4c, there is mounted a bushing 4d made of non-lubricated resin or the like in order to reduce kinetic frictional resistance between the fixed pipe 3 and the hole 4c. Further, on the external surface of the movable pipe 4, there are formed a first collar 4e and a second collar 4f, and the outside diameter of an upper side portion of the first collar 4e of the movable pipe 4 is slightly smaller than the inside diameter of the inner hole 2e2 of the bushing 2e. This movable pipe 4 is arranged in annular space between the bushing 2e and the fixed pipe 3 in such a manner as to be movable vertically. Also, between the bushing 2e and the first collar 4e, there is interposed a first coiled spring CS1, between the first collar 4e and the second collar 4f, there is interposed a second coiled spring CS2, and between the second coiled spring CS2 and the second collar 4f, there is inserted an U-character-shaped engaging portion 13c of the driving lever 13. The movable pipe 4 is biased downward by the first coiled spring CS1 so that the top end of the movable pipe 4 in a standby state is located at a lower position than the top end of the fixed pipe 3. In the drawings, there has been exemplified a movable pipe in which force relationship between the first coiled spring CS1 and the second coiled spring CS2 is set to CS1<CS2, but the force relationship between the first coiled spring CS1 and the second coiled spring CS2 may be CS1=CS2 or CS1>CS2.

A first component guide 6 has, as shown in FIG. 3, a groove 6a for a pipe mounting hole, and a component passage groove 6b connected thereto on the left side, and is secured to the left side of the frame 1 by screws. The groove 6b consists of a curved portion and a long-sideways portion, and has a slightly larger rectangular cross section than a shape of an end surface of the electronic component EC. Also, an aperture edge of the long-sideways portion of the groove 6b is formed with an air auxiliary passage groove 6c being shallower than the groove 6b from the front end thereof to this side of the curved portion. On the left side of the first component guide 6, a transparent first cover 7 is detachably secured by screws so as to block respective side apertures for the groove 6a for a pipe mounting hole, the component passage groove 6b and the air auxiliary passage groove 6c. More specifically, the groove 6a for a pipe mounting hole is blocked at its side aperture by the first cover 7, whereby the groove serves as the pipe mounting hole, and as shown in FIG. 4, the component passage groove 6b is blocked at its side aperture by the first cover 7, whereby the component passage groove 6b serves as the component passage (hereinafter, the same symbol 6b as the groove 6b will be cited). The air auxiliary passage groove 6c is blocked at its side aperture by the first cover 7, whereby the air auxiliary passage groove 6c serves as the air auxiliary passage (hereinafter, the same symbol 6c as the groove 6c will be cited).

A second component guide 8 has, as shown in FIGS. 6 and 7, a component passage groove 8a on the top surface, and is secured to the left side of the frame 1 by screws in such a manner that the groove 8a is continuous to the above-described component passage 6b without any difference in level. The groove 8a consists of a long-sideways portion and a curved portion, and has a slightly larger rectangular cross section than a shape of an end surface of the electronic component. Also, aperture edges of the long-sideways portion and the curved portion of the groove 8a are formed with an air auxiliary passage groove 8b being shallower than the groove 8a from the front end thereof to the rear end in such a manner that it communicates to the above-described air auxiliary passage 6b. As shown in FIG. 5, on the nearly left half of the top surface of the second component guide 8, a transparent second cover 9 is detachably secured by a setscrew FS so as to block top surface apertures other than tip end portions of the component passage groove 8a and the air auxiliary passage groove 8b. In other words, the component passage groove 8a is blocked at the top surface apertures other than the tip end portions by the second cover 9 as shown in FIGS. 5 and 8, whereby the component passage groove 8a serves as the component passage (hereinafter, the same symbol 8a as the groove 8a will be cited), and the air auxiliary passage groove 8b is blocked at the top surface apertures other than the tip end portions by the second cover 9, whereby the air auxiliary passage groove 8b serves as the air auxiliary passage (hereinafter, the same symbol 8b as the groove 8b will be cited).

Also, on the right side of the top surface of the second component guide 8, there is formed a concave portion 8c for housing the component stopper. This concave portion 8c has such a shape of top surface as shown in FIG. 7, and the component passage groove 8a and the air auxiliary passage groove 8b are extendedly provided to the left side of a narrow portion of the concave portion 8c. The depth of the concave portion 8c is slightly larger than the thickness of the component stopper 10, and a base of the narrow portion is formed with an air flow port 8d, and on the underside thereof, there is formed an air tube connecting hole 8e so as to penetrate, and on the base of a wide portion of the concave portion 8c, there is formed a tapped hole 8f for mounting the supporting shaft SS1. Further, on the top surface of the second component guide 8, there are formed a tapped hole 8g for mounting a setscrew FS for the second cover, and a tapped hole 8h for mounting the supporting shaft SS2.

The component stopper 10 has such a shape of top surface as shown in FIG. 9A, and predetermined thickness. As can be also seen from FIGS. 9B to 9D, in the front end portion of the component stopper 10, air flow ports 10a having a semicircular cross section are formed at a predetermined interval so as to penetrate, and between two air flow ports 10a, there is formed a concave portion 10b. To this concave portion 10b, a permanent magnet MG made of samarium-cobalt magnet or the like is fixed such that one of N-pole and S-pole is opposite to an attraction wall 10c. The thickness of the permanent magnet MG is smaller than the depth of the concave portion 10b, and the height of the top surface of the attraction wall 10c coincides with that of this permanent magnet MG. More specifically, on the upper side of the permanent magnet MG and the attraction wall 10c, there is formed an air flow channel 10d for communicating to the top portion of two air flow ports 10a while the top surface of the component stopper 10 is covered by the shutter 11, and in the component stopper 10, there is constituted an air suction path capable of communicating to the tip end of the component passage 8a by means of the air flow port 10a and the air flow channel 10d. Also, on the left side of the rear end portion of the component stopper 10, there is formed a hole 10e for housing a third coiled spring CS3, and on the right side thereof, there is formed a curved surface portion 10f. Further, at the center of the component stopper 10, there is formed a hole 10g, into which the supporting shaft SS1 is inserted. After the third coiled spring CS3 is mounted in the hole 10e as shown in FIG. 6, the supporting shaft SS1 inserted into the hole 10g is mounted into the tapped hole 8f in the second component guide 8, whereby the component stopper 10 is arranged within the concave portion 8c in the second component guide 8. The component stopper 10 rotatably supported by the supporting shaft SS1 is biased in anti-clockwise direction by the third coiled spring CS3 so that the attraction wall 10c is in contact with the left side of the narrow portion of the concave portion 8c.

The shutter 11 has such a shape of top surface as shown in FIG. 10A, and predetermined thickness. As can be also seen from FIG. 10B, in the front end portion of the shutter 11, there is formed a guide groove 11a, into which the front-side supporting shaft SS2 is inserted, and in the rear portion, there is formed a guide hole 11b, into which the rear-side supporting shaft SS2 is inserted. Also, behind the guide groove 11a of the shutter 11, there is formed a component outlet port 11c capable of opening the tip end portions of the component passage groove 8a and the air auxiliary passage groove 8b. Further, at the substantially center of the shutter 11, a protrusion lid with a slope for causing the component stopper 10 to make rotational displacement is provided so as to protrude on the under surface side. Further, on the back side of a guide hole 11b of the shutter 11, there is formed an engaging hole lie, into which an engaging portion 14a of the driving plate 14 is inserted. As shown in FIG. 5, the supporting shafts SS2 inserted into the guide groove 11a and the guide hole 11b are mounted into the tapped holes 8h in the second component guide 8, whereby this shutter 11 is arranged on the top surface of the second component guide 8 so as to block the top surface aperture of the concave portion 8c and the tip end portions of the component passage groove 8a and the air auxiliary passage groove 8b. In other words, the tip end portion of the component passage groove 8b is blocked at its top surface aperture by the shutter 11, whereby the tip end portion of the component passage groove 8a serves as the component passage (hereinafter, the same symbol 8a as the groove 8a will be cited), and the tip end portion of the air auxiliary passage groove 8b is blocked at its top surface aperture by the shutter 11, whereby the tip end portion of the air auxiliary passage groove 8b serves as the air auxiliary passage (hereinafter, the same symbol 8b as the groove 8b will be cited). The shutter 11 is capable of moving in a back-and-forth direction while being regulated in direction by means of two supporting shafts SS2. The component outlet port 11c of the shutter 11 in a stand-by state is deviated forward from the tip end portions of the component passage 8a and the air auxiliary passage 8b.

The operating lever 12 has such a shape of left side as shown in FIG. 11, and predetermined thickness. On the left side of the top end portion of the operating lever 12, a first roller 12a is rotatably provided, and on the right side of the underside thereof, there are provided a second roller 12b for the driving lever, and a third roller 12c for the driving plate. Also, between a second roller 12b of the operating lever 12 and the third roller 12c, there is formed a hole 12d for engaging one end of the fourth coiled spring CS4, and at the lower end of the operating lever 12, there is formed a hole 12e for coupling a coupled plate 15b provided for a rod 15a of the air cylinder 15. Further, the bent portion of the operating lever 12 is formed with a hole 12f, through which the supporting shaft SS3 is inserted. As shown in FIG. 1, the supporting shaft SS3 inserted through the hole 12f is mounted in a tapped hole (not shown) in the frame 1, and the fourth coiled spring CS4 is extended between the hole 12d and the frame 1, whereby this operating lever 12 is arranged on the left side of the frame 1. The operating lever 12 rotatably supported by the supporting shaft SS3 is biased in anti-clockwise direction by the fourth coiled spring CS4 so that it is in contact with the first stopper 1a.

The driving lever 13 has such a shape of left side as shown in FIG. 12, and predetermined thickness. At the front end of the driving lever 13, there is formed an inclined surface 13a, and in the rear portion, a 90° bent plate-shaped portion 13b is integrally formed, and at the rear end portion of the plate-shaped portion 13b, there is formed a U-character-shaped engaging portion 13c. Also, at the center of the driving lever 13, there is formed a hole 13d, through which the supporting shaft SS4 is inserted. The supporting shaft SS4 inserted through the hole 13d is mounted in a tapped hole (not shown) in the frame 1, whereby the driving lever 13 is arranged on the side of the left side of the frame 1 as shown in FIG. 1. An engaging portion 13c of the driving lever 13 rotatably supported by the supporting shaft SS4 is inserted between the second coiled spring CS2 and the second collar 4f, and the driving lever 13 is biased in clockwise direction by the first coiled spring CS1 so that it is in contact with the first stopper 1b. Also, a flat surface 13a of the driving lever 13 is located in contact or in non-contact on the underside of the second roller 12b of the operating lever 12.

The driving plate 14 has such a shape of left side as shown in FIG. 13, and predetermined thickness. On the underside at the font end of the driving plate 14, there is formed an engaging portion 14a capable of being inserted into an engaging hole lie of the shutter 11. Also, in the front and rear portions of the driving plate 14, there is formed a guide hole 14b, through which the supporting shaft SS5 is inserted. Further, behind a front-side guide hole 14b of the driving plate 14, there is formed a slit 14c for housing a fifth coiled spring CS5, and behind it, there is formed a hole 14d for engaging one end of the fifth coiled spring CS5. Further, behind a guide hole 14b behind the driving plate 14, there is formed a long-sideways control hole 14e in which a third roller 12c of the operating lever 12 can be inserted. As shown in FIG. 1, the supporting shafts SS5 inserted into two guide holes 14b are mounted into tapped holes (not shown) in the frame 1, the fifth coiled spring CS5 is extended between the hole 14d and the frame 1 through the use of the slit 14c, the engaging portion 14a is inserted into an engaging hole lie in the shutter 11, and the second roller 12c of the operating lever 12 is inserted into the control hole 14e, whereby this driving plate 14 is arranged on the side of the left side of the frame 1. The driving plate 14 is capable of moving in a back-and-forth direction while being regulated in direction by two supporting shafts SS5, and is biased forward by the fifth coiled spring CS5 so that the rear ends of the both guide holes 14b are in contact with the supporting shafts SS5. Also, the second roller 12c of the operating lever 12 inserted into the control hole 14e is located in front of the control hole 14e.

An air cylinder 15 is of a double-acting type having two air supply/release ports, and is, at its front end portion, rotatably supported by means of the supporting shafts SS6 mounted in tapped holes (not shown) in the frame 1. The rod 15a of the air cylinder 15 is, at its tip end, mounted with a connecting plate 15b, and this connecting plate 15b is rotatably connected to a hole 12e in the operating lever 12. Also, to one air supply/release port of the air cylinder 15, there is connected a control valve 16 for diverging an air suction port and an air release port. Particularly, the air cylinder 15 has such valve structure that as valve symbols are shown in FIG. 1, when the rod 15a retracts, the back side of the control valve 16 serves as the air release port, and when the rod 15a advances from the retract position, the front side of the control valve 16 serves as the air suction port. Incidentally, the other air supply/release port of the air cylinder 15 is open to the open air.

An air tube 17 is, at its one end, connected to the air suction port of the control valve 16, while it is, at the other end, connected to a connecting hole 8e of the second component guide 8 through an adequate connection fitting. More specifically, on the air flow port 8d of the second component guide 8, an air suction force acts only when the rod 15a of the air cylinder 15 advances.

Hereinafter, with reference to FIGS. 14 to 22, the description will be made of an operation of an apparatus according to the first embodiment.

Figure 14:
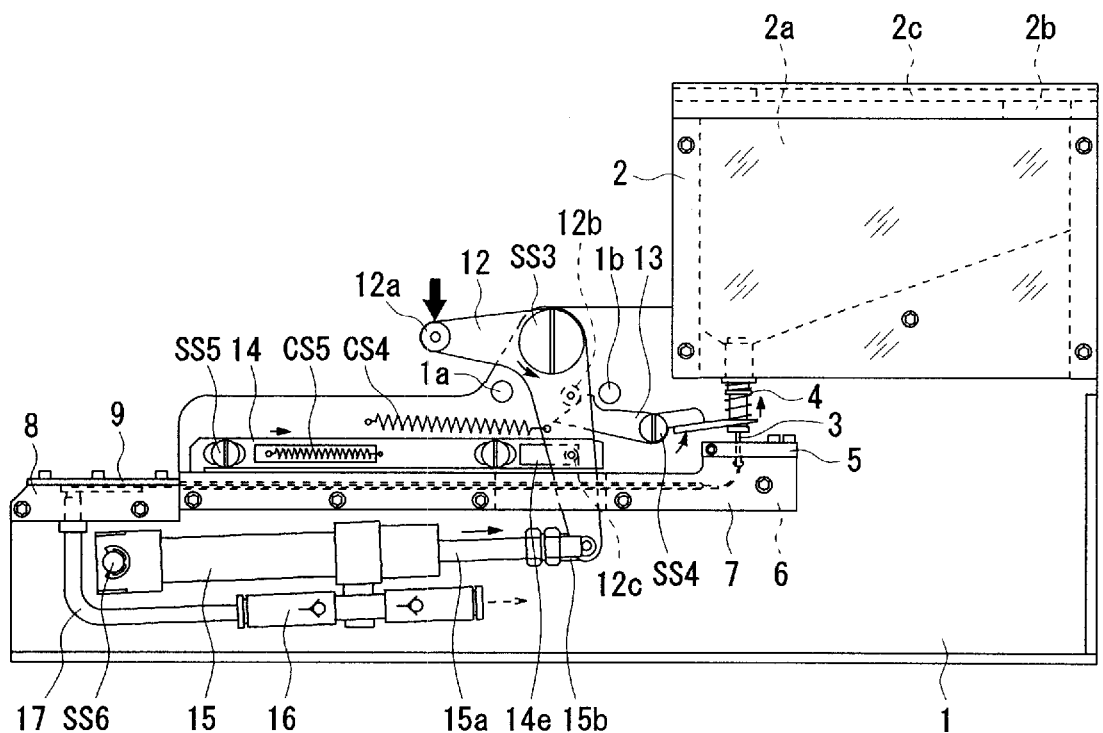
FIG. 14 is an explanatory view showing an operation of the apparatus shown in FIG. 1.
Figure 15:
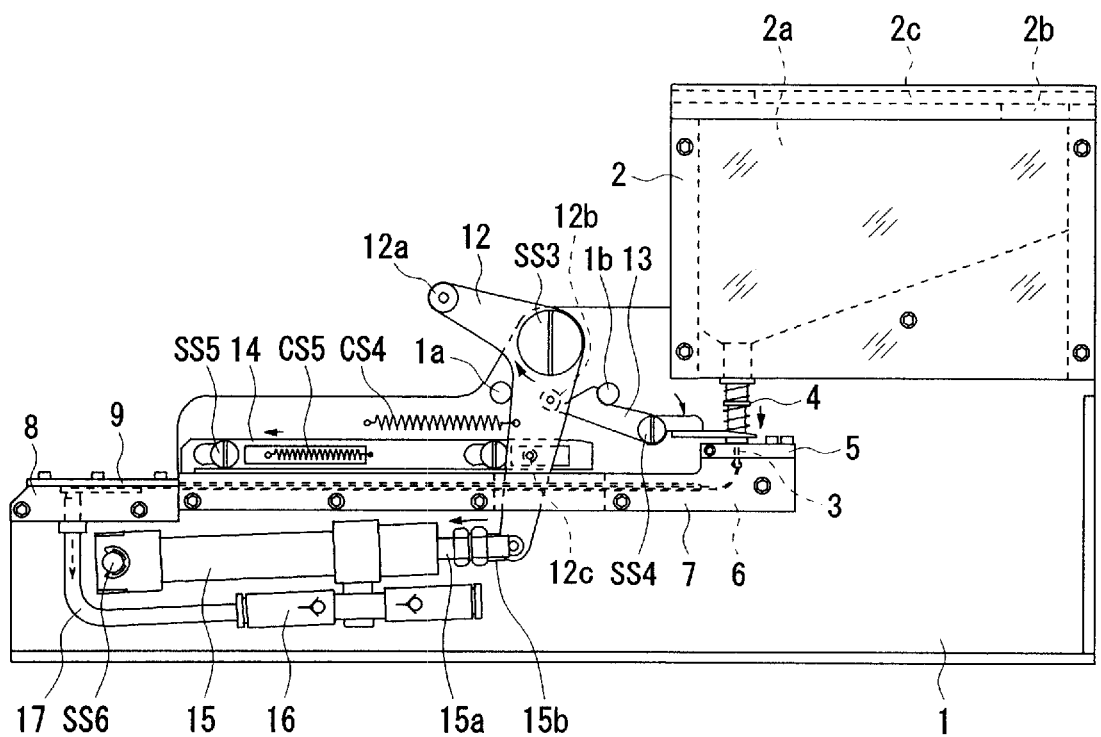
FIG. 15 is an explanatory view showing the operation of the apparatus shown in FIG. 1.

The apparatus according to the first embodiment repeats such an operation as to depress the first roller 12a of the operating lever 12 from the stand-by state shown in FIG. 1 by a predetermined stroke, and thereafter to return the operating lever 12 at a predetermined cycle (See symbol tt in FIG. 22), for example, at about 0.1 second as shown in FIGS. 14 and 15 to thereby perform intended component supply.

When the first roller 12a of the operating lever 12 is depressed, the operating lever 12 rotates in anti-clockwise direction as shown in FIG. 14, and the second roller 12b of the operating lever 12 presses down an inclined surface 13a of the driving lever 13 to rotate the driving lever 13 in anti-clockwise direction.

Figure 16:
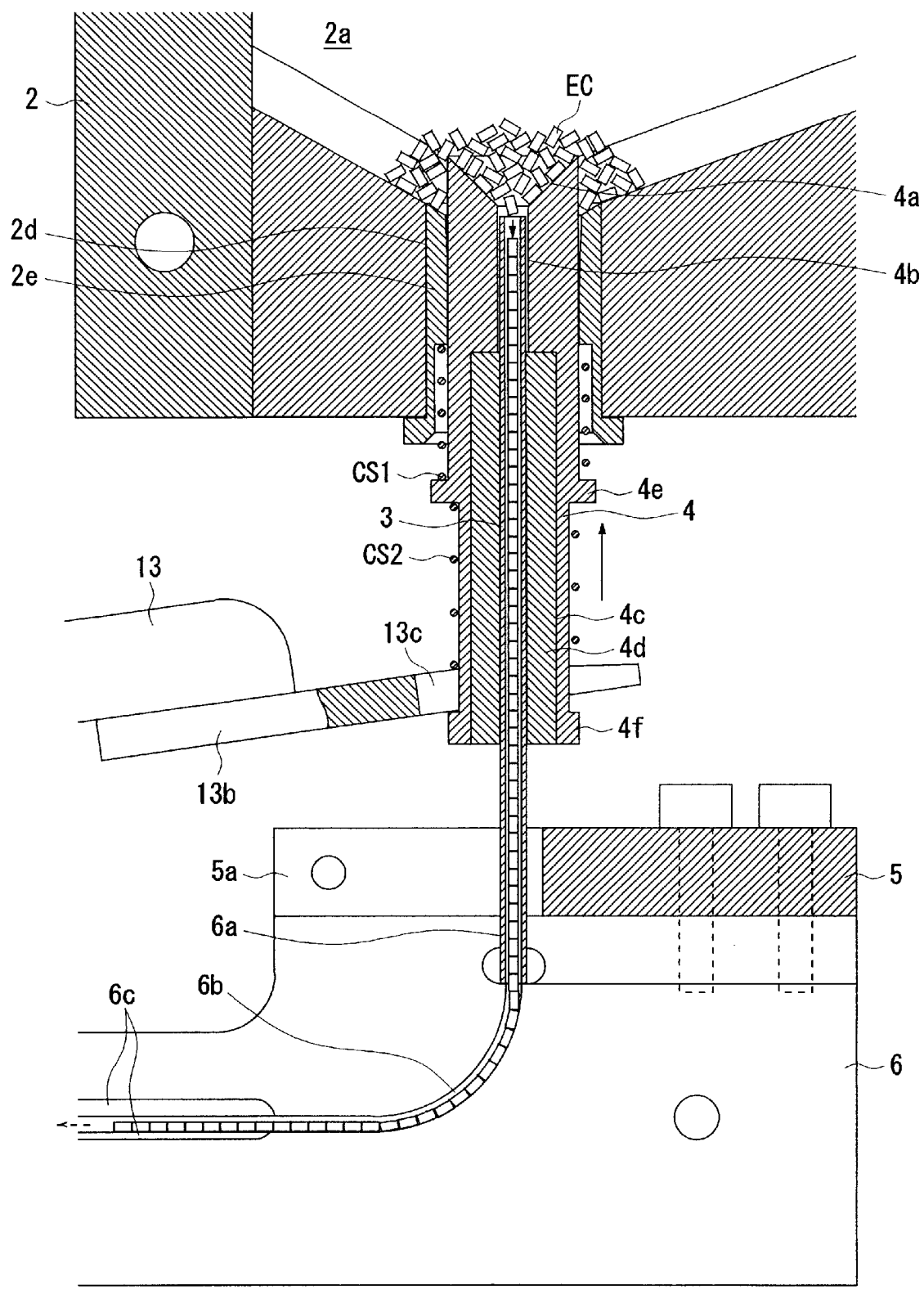
FIG. 16 is an explanatory view showing the operation of the apparatus shown in FIG. 1.

When the driving lever 13 rotates in anti-clockwise direction, the movable pipe 4 rises by a predetermined stroke while the first coiled spring CS1 is being compressed, and the rise of this movable pipe 4 raises electronic components EC located above the movable pipe 4 upwardly as shown in FIG. 16 so that the electronic components EC within the storeroom 2a are subjected to an agitating operation. Thereby, the stored components EC enter the top end of the inner hole of the fixed pipe 3 on a one-by-one basis lengthwise through the use of the inclined guide surface 4a, or directly. The electronic components EC, which have entered the inner hole of the fixed pipe 3, move downward within the inner hole by gravity to enter the component passage 6b, and when passing through the curved portion by gravity, their posture is changed from a vertical position to a horizontal position to enter the long-sideways portion. Since the curved portion and the long-sideways portion of the component passage 6b have both a rectangular cross section, the orientations of four sides except for both end surfaces in the longitudinal direction of the electronic components EC are corrected mainly when passing through the curved portion, and substantially conform to the four inner surfaces of the component passage 6b when entering the long-sideways portion.

After a lapse of predetermined time (see a symbol t1 of FIG. 22) from the commencement of the depressed first roller 12a of the operating lever 12, in other words, immediately before the depressing operation is completed, the third roller 12c of the operating lever 12 comes into contact with the rear end of the control hole 14e of the driving plate 14, and thereafter, with rotational displacement of the operating lever 12, the driving plate 14 retracts.

Figure 17:
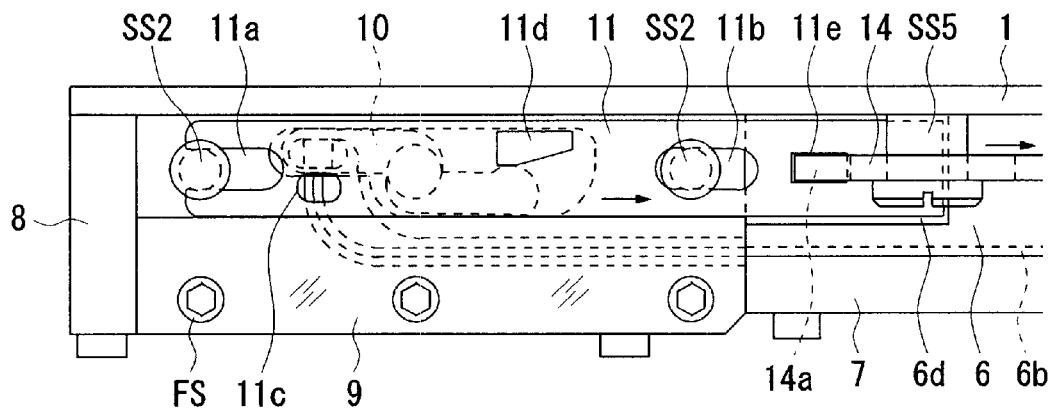
FIG. 17 is an explanatory view showing the operation of the apparatus shown in FIG. 1.

When the driving plate 14 retracts, the engaging hole lie is drawn in backward by the engaging portion 14a of the driving plate 14 as shown in FIG. 17 to retract the shutter 11 by a predetermined stroke, whereby the component outlet port 11c of the shutter 11 coincides with the tip end portions of the component passage 8a and the air auxiliary passage 8b to expose the tip end portion of the component passage 8a through the component outlet port 11c.

Figure 18:
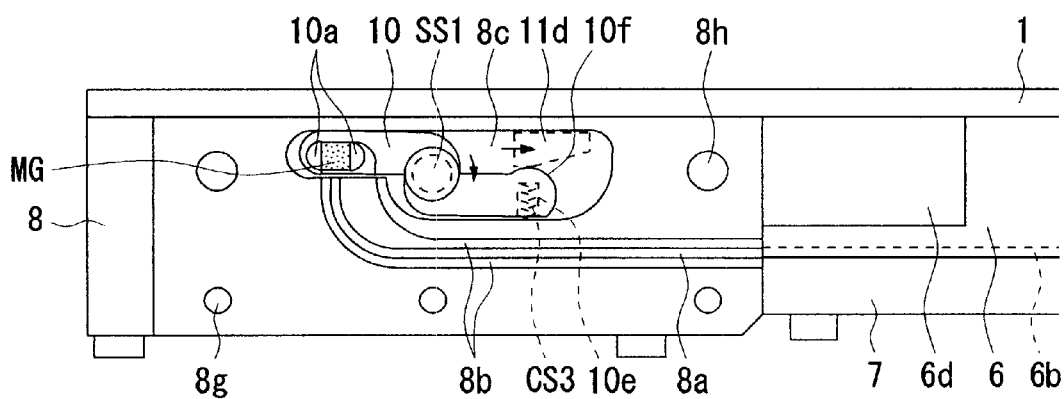
FIG. 18 is an explanatory view showing the operation of the apparatus shown in FIG. 1.
Figure 19:
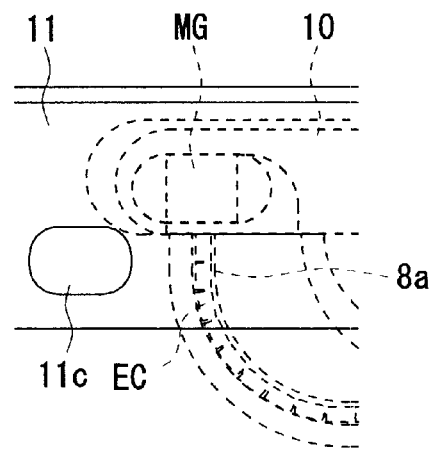
FIGS. 19A and 19B are explanatory views each showing the operation of the apparatus shown in FIG. 1.
Figure 19:
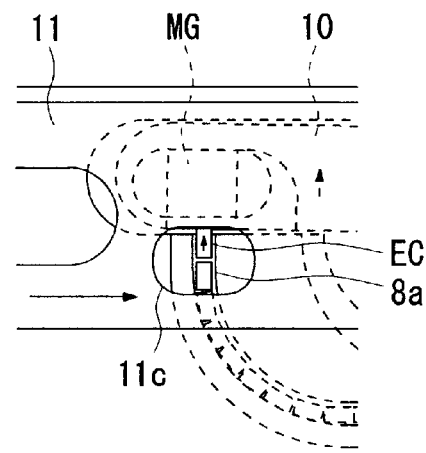
Figure 20:
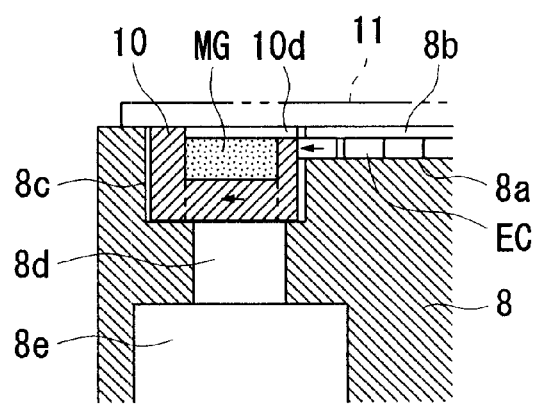
FIG. 20 is an explanatory view showing the operation of the apparatus shown in FIG. 1.
Figure 21:
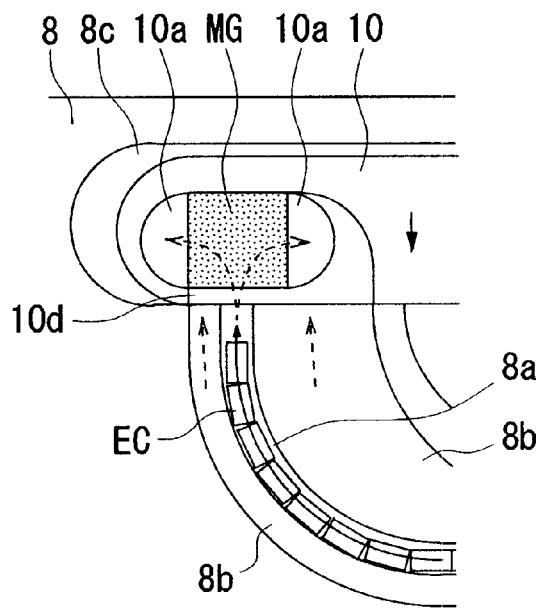
FIGS. 21A and 21B are explanatory view each showing the operation of the apparatus shown in FIG. 1.
Figure 21:
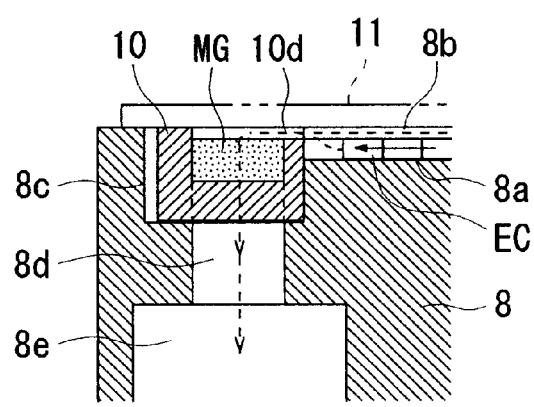

When the shutter 11 retracts, the slope of the protrusion lid of the shutter 11 comes into contact with the curved surface portion 10f of the component stopper 10 as shown in FIG. 18 to press the curved surface 10f in the left direction, whereby the component stopper 10 rotates by a little angle, for example, about 3° in clockwise direction against the biasing force of the third coiled spring CS3 so that the attraction wall 10c leaves the left side of the narrow portion of the concave portion 8c. When a foremost electronic component EC within the component passage 8a is attracted on the attraction wall 10c by means of a magnetic force of a permanent magnet MG as shown in FIG. 19A, the foremost electronic component EC slightly moves in the right direction together with the attraction wall 10c with rotational displacement of the component stopper 10 as shown in FIGS. 19B and 20, whereby the foremost electronic component EC is separated from the succeeding components. Incidentally, time t2 of FIG. 22 is time to take out the foremost electronic component EC from the component outlet port 11c by means of an attraction nozzle or the like.

Figure 22:
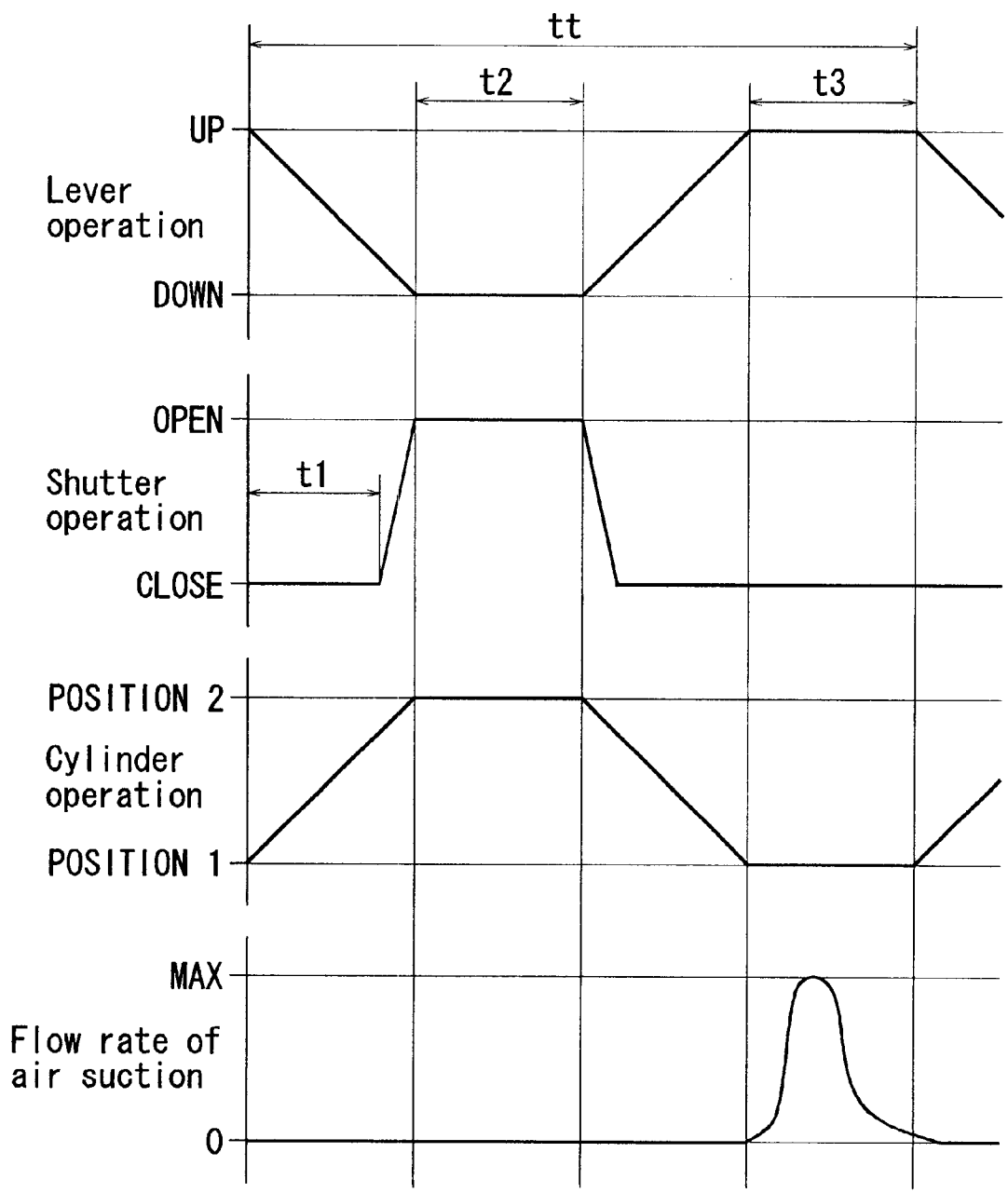
FIG. 22 is an explanatory view showing the operation of the apparatus shown in FIG. 1.

Also, when the first roller 12a of the operating lever 12 is depressed, the rod 15a of the air cylinder 15 coupled to the operating lever 12 retracts as shown in FIG. 14 in synchronization with rotational displacement of the operating lever 12 (See movement from POSITION 1 to POSITION 2 of FIG. 22). Since the back side of the control valve 16 serves as the air release port at this time, air is released into the outside as indicated by an arrow of broken line as the rod 15a retracts.

On the other hand, after a lapse of predetermined time (see a symbol t2 of FIG. 22) from the completion of the depressed first roller 12a of the operating lever 12, the depressed first roller 12a of the operating lever 12 is released as shown in FIG. 15 so that the operating lever 12 returns to the original position by means of biasing force of the fourth coiled spring CS4.

When the operating lever 12 returns to its original state, the driving lever 13 returns to its original state by means of the biasing force of the first coiled spring CS1 in synchronization therewith to lower the movable pipe 4 from the raised position by a predetermined stroke. This descent of the movable pipe 4 causes, as shown in FIG. 3, the electronic components EC located above the movable pipe 4 to lower so that electronic components EC within the storeroom 2a are subjected to the same agitating operation as described above. Thereby the stored components EC enter the top end of the inner hole of the fixed pipe 3 on a one-by-one basis lengthwise through the use of the inclined guide surface 4a, or directly. The electronic components EC, which have entered the inner hole of the fixed pipe 3, move downward within the inner hole by gravity to enter the component passage 6b, and when passing through the curved portion by gravity, their posture is changed from a vertical position to a horizontal position to enter the long-sideways portion. Since the curved portion and the long-sideways portion of the component passage 6b have both a rectangular cross section, the orientations of four sides except for both end surfaces of the electronic components EC in the longitudinal direction are corrected mainly when passing through the curved portion, and substantially conform to the four inner surfaces of the component passage 6b when entering the long-sideways portion.

Also, when the operating lever 12 starts to return to its original state, the driving plate 14 advances by means of the biasing force of the fifth coiled spring CS5 in synchronization therewith. The advance of the driving plate 14 causes, as shown in FIG. 5, the shutter 11 to be pushed forward by means of the engaging portion 14a of the driving plate 14 to advance by a predetermined stroke, whereby the component outlet port 11c is deviated forward from the tip end portions of the component passage 8a and the air auxiliary passage 8b to block the tip end portion of the component passage 8a again. Also, when the shutter 11 advances, the protrusion lid of the shutter 11 is separated from the curved surface portion 10f of the component stopper 10 so that the component stopper 10 rotates in anti-clockwise direction by means of the biasing force of the third coiled spring CS3 for returning to its original state, and the attraction wall 10c comes into contact with the left side of the narrow portion of the concave portion 8c again.

Further, when the operating lever 12 returns to its original state, the rod 15a of the air cylinder 15 makes a displacement forward (see movement of POSITION 2 to POSITION 1 of FIG. 22) from the retracted position in synchronization therewith. Since the front side of the control valve 16 serves as the air suction port at this time, the air suction force acts on the air flow port 8d of the second component guide 8 through the air tube 17 along with the advancement of the rod 15a. The air flow port 8d of this second component guide 8 communicates to the tip end portions of the component passage 8a and the air auxiliary passage 8b through the air flow port 10a and the air flow channel 10d of the component stopper 10, and therefore, a flow of air toward the component stopper 10 occurs even in the component passage 8a, the air auxiliary passage 8b, a rear-side component passage 6b continuing to these, and the air auxiliary passage 6c as indicated by an arrow of broken line in FIGS. 21A and 21B.

This flow of air does not occur as soon as the rod 15a of the air cylinder 15 starts the advancement, but actually starts to occur immediately after the advancement of the rod 15a has been completed as shown in FIG. 22, and its flow rate shows such a curvilinear change that it slowly rises from zero value to reach the maximum value, and thereafter reduces to the zero value again. According to the flow of air shown in FIG. 22, a time range in which the flow of air is occurring is a range: from return of the operating lever 12 to the original state to immediately after depression of the first roller 12a is started again, but within the same time range, retraction of the shutter 11 has not been started, but no impediment occurs in the operation because the tip end portions of the component passage 8a and the air auxiliary passage 8b are covered with the shutter 11.

When a flow of air toward the component stopper 10 occurs even in the component passage 8a, the air auxiliary passage 8b, a rear-side component passage 6b continuing to these, and the air auxiliary passage 6c, the electronic components EC, which have entered the long-sideways portion of the component passage 6b, move forward by means of the flow of air to enter the component passage 8a. Of the electronic components EC which have further entered the component passage 8a, the foremost electronic component EC abuts on the attraction wall 10c of the component stopper 10 to be attracted and held on the attraction wall 10c by means of the magnetic force of the permanent magnet MG.

After a lapse of predetermined time (see a symbol t3 of FIG. 22) from the completion of the return of the operating lever 12, the first roller 12a of the operating lever 12 is depressed by a predetermined stroke again to perform the same operation as described above. Incidentally, the time t3 of FIG. 22 is waiting time when the first roller 12a of the operating lever 12 returned is depressed again.

As described above, in the above-described apparatus, by utilizing such an operation as to return the operating lever 12 to its original state after the first roller 12a of the operating lever 12 is depressed by a predetermined stroke, the rod 15a of the air cylinder 15 is caused to retract and advance; through the use of the air suction force when the rod 15a advances, a flow of air toward the component stopper 10 is caused to occur even in the component passage 8a, the air auxiliary passage 8b, a rear-side component passage 6b continuing to these, and the air auxiliary passage 6c; and through the use of this flow of air, the electronic components EC within the component passages 6b and 8a are caused to move forward in the lined-up state, whereby it is possible to cause the foremost electronic component EC to abut on the attraction wall 10c of the component stopper 10. In other words, in addition to being able to precisely execute supply of square pillar-shaped electronic components EC, it is possible to construct the apparatus itself simply at low cost, because such a belt and its moving mechanism, a large-sized suction source such as a vacuum pump, air piping from this suction source and the like as in the conventional case are not required in order to convey the components.

Also, the foremost electronic component within the component passage 8a can be attracted and held on the attraction wall 10c of the component stopper 10 by means of a magnetic force of the permanent magnet MG, and yet when the tip end portion of the component passage 8a is exposed through the component outlet port 11c of the shutter 11, the foremost electronic component EC can be separated from the succeeding components by means of rotational displacement of the component stopper 10. Therefore, when the foremost electronic component EC is taken out of the component outlet port 11c by means of the attraction nozzle or the like, it is possible to satisfactorily perform a component taking-out operation by preventing the electronic component EC to be taken out from interfering with the succeeding components.

Further, since the shutter 11 is caused to retract immediately before the depression of the first roller 12a of the operating lever 12 is completed, it is possible to reliably cover the tip end portions of the component passage 8a and the air auxiliary passage 8b with the shutter 11 when a flow of air is actually occurring in the component passages 8a and 6b, whereby it is possible to precisely execute component conveyance using air suction. Also, since the tip end portion of the component passage 8a can be exposed only during a duration corresponding to component taking-out, problems caused by the tip end portion of the component passage 8a to be unnecessarily exposed for many hours such as, for example, entry of dust and the like can be prevented.

Further, there is provided an air flow port 8d on the upper side of the connecting hole 8e of the second component guide 8, to which the air tube 17 has been connected, and this air flow port 8d communicates to the tip end portions of the component passage 8a and the air auxiliary passage 8b through the air flow port 10a of the component stopper 10 and the air flow channel 10d, and therefore, it is possible to construct a simple air suction route with low pressure loss and flow rate loss.

In this respect, in the above-described first embodiment, the double-acting type having two air supply/release ports was used as the air cylinder 15, the control valve 16 was connected to one air supply/release port and the other air supply/release port was opened to the open air. However, in order to prevent dust and the like from being sucked together with air into the air cylinder 15 from the other air supply/release port when the rod 15a retracts, it may be possible to arrange a filter in the other air supply/release port. Also, when air is sucked into the control valve 16 through the air tube 17, in order to prevent dust and the like from being sucked within the control valve 16 and within the air cylinder 15 together with air, it may be possible to arrange a filter in the air suction port of the control valve 16. Of path, a single-acting type having a single air supply/release port may be used as the air cylinder 15.

Also, a sectional area ratio of the component passage 6b, 8a shown in the first embodiment described above to the air auxiliary passage 6c, 8b must be properly set when the components are conveyed by means of air suction. As a result of various experiments, a sectional area ratio of a desirable air auxiliary passage is 20 to 120 assuming the sectional area of the component passage to be 100. When the sectional area ratio of the air auxiliary passage is excessively low although it also depends upon the size of the electronic component EC to be handled, it becomes difficult to secure a sufficient flow of air to convey the components during air suction, and when the sectional area ratio of the air auxiliary passage is excessively high on the contrary, it becomes difficult to convey the components because of reduced flow velocity and the like.

Second Embodiment

Figure 23:
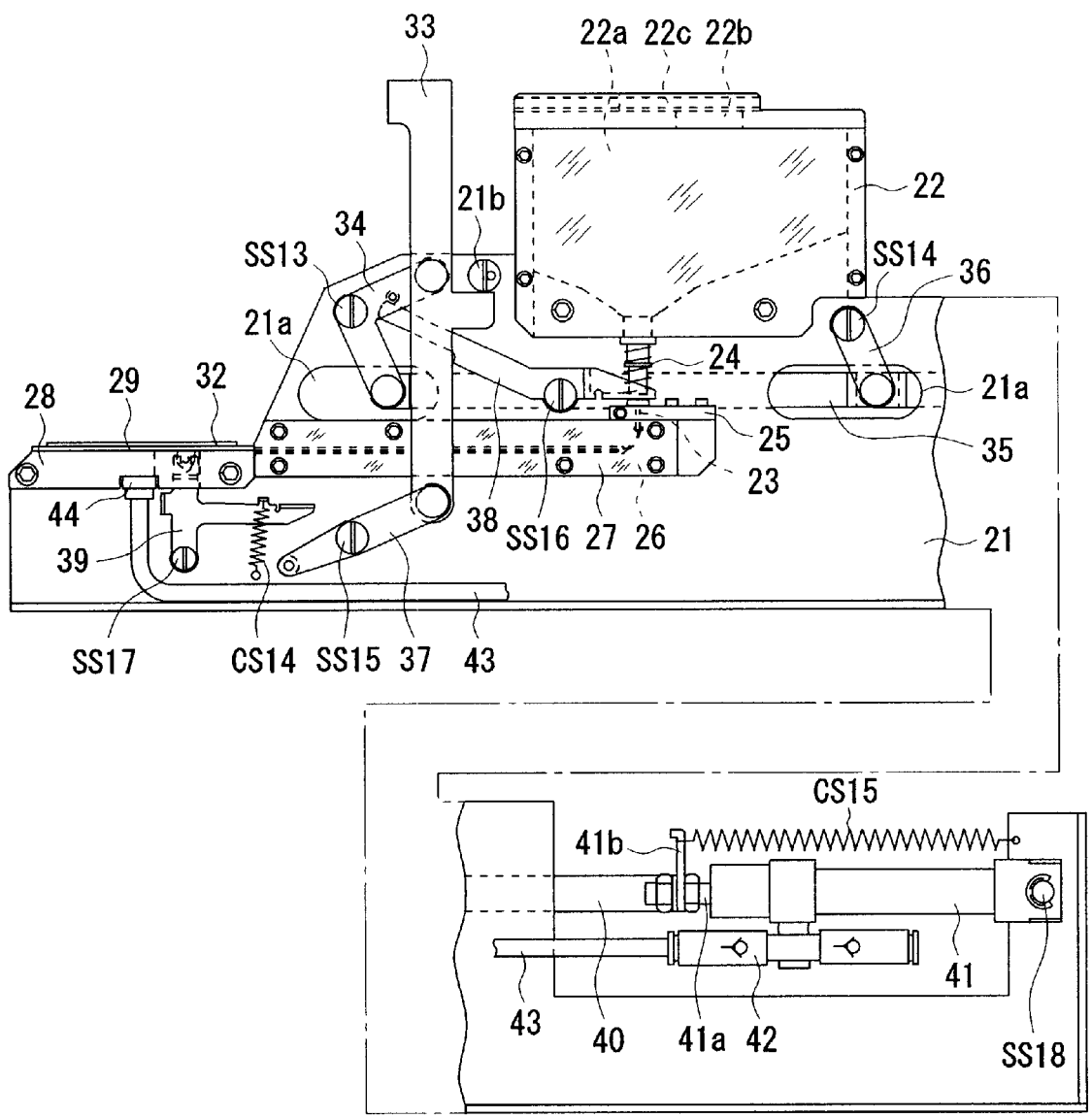
FIG. 23 is a left side view showing an electronic component feeding apparatus according to a second embodiment of the present invention.

FIGS. 23 to 45 show a second embodiment according to the present invention, and in the following description, the left side of FIG. 23 is indicated as front, the right side, as behind, this side, as left, and the inside, as right.

Figure 24:
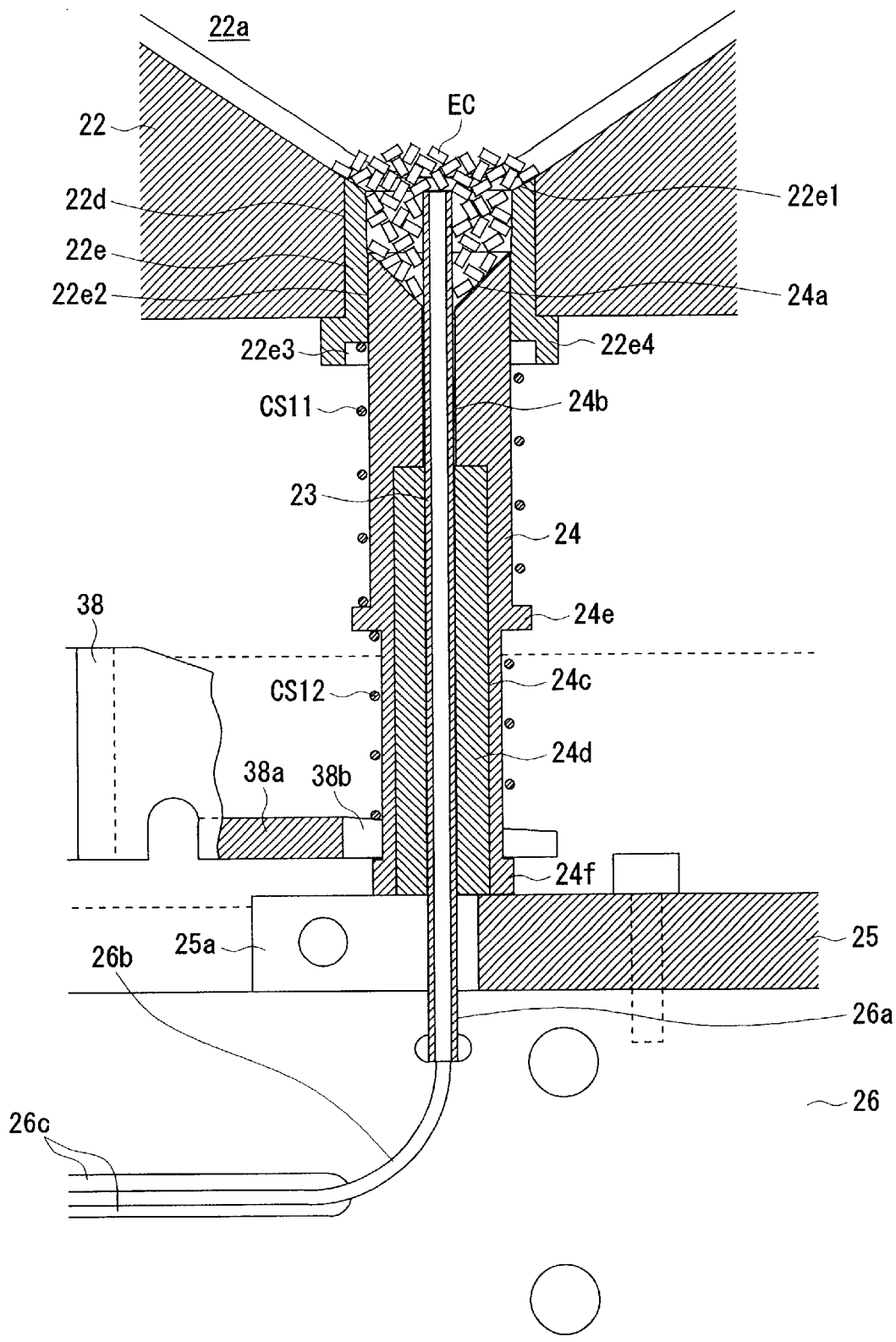
FIG. 24 is a partially-enlarged longitudinal sectional view showing the apparatus shown in FIG. 23.
Figure 25:
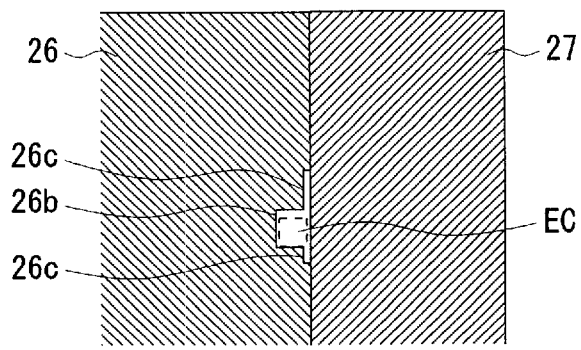
FIG. 25 is a partially-enlarged longitudinal sectional view showing a component passage of a first component guide portion of the apparatus shown in FIG. 23.
Figure 26:
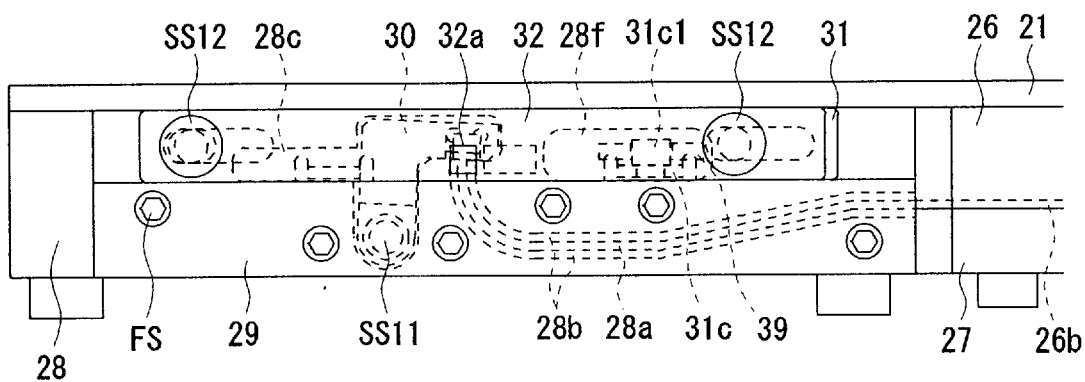
FIG. 26 is a partially-enlarged top view showing the apparatus shown in FIG. 23.
Figure 27:
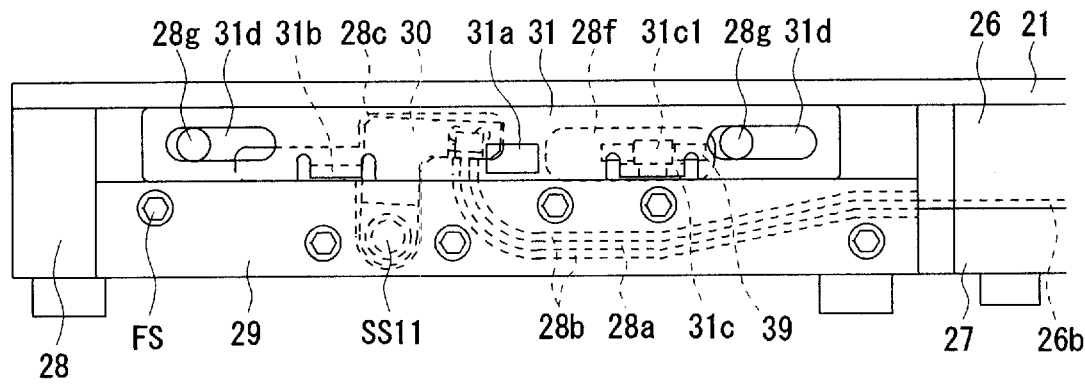
FIG. 27 is a view obtained by excluding a fixed shutter and a supporting shaft from FIG. 26.
Figure 28:
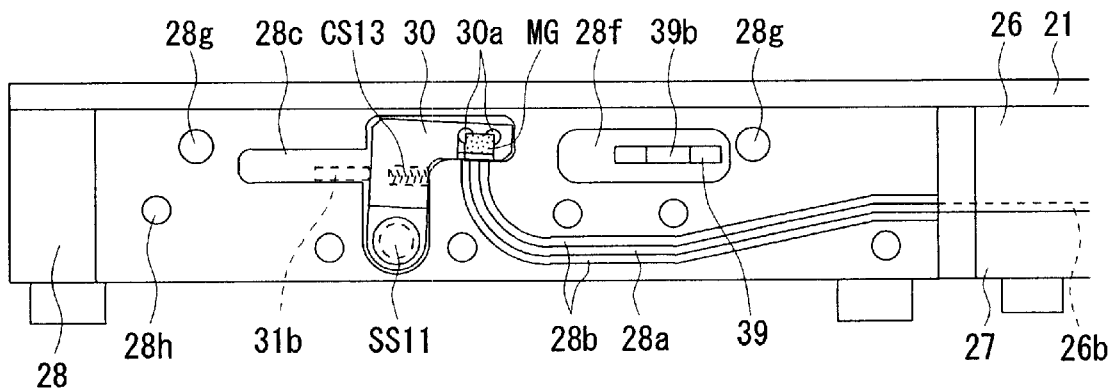
FIG. 28 is a view obtained by excluding a movable shutter from FIG. 27.
Figure 29:
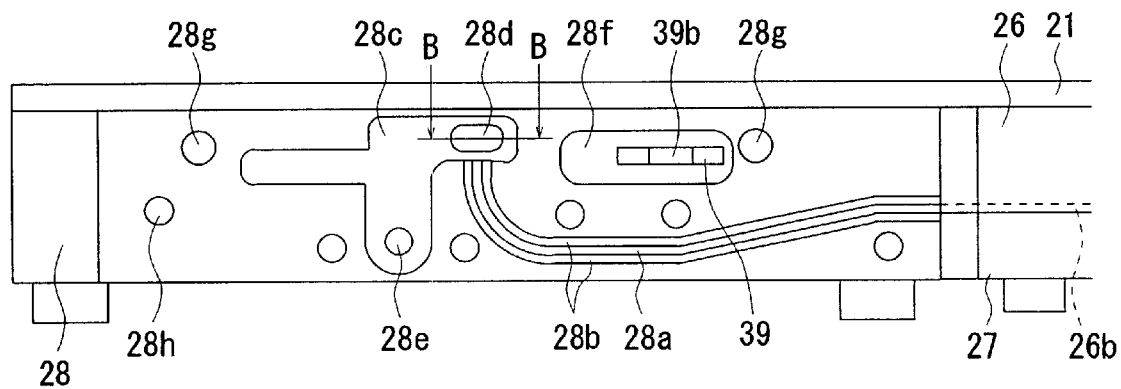
FIG. 29 is a view obtained by excluding a component stopper and a supporting shaft from FIG. 28.
Figure 30:
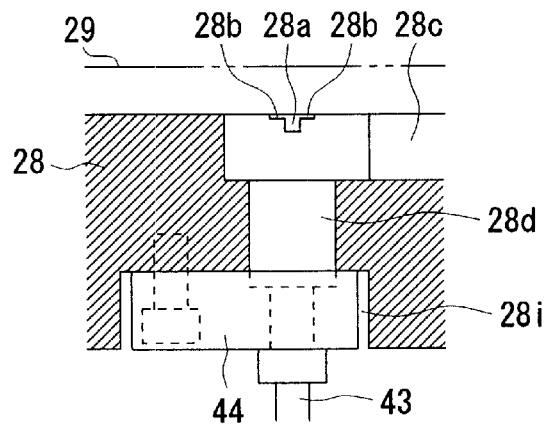
FIG. 30 is a sectional view taken on a line B—B of FIG. 29.
Figure 31:
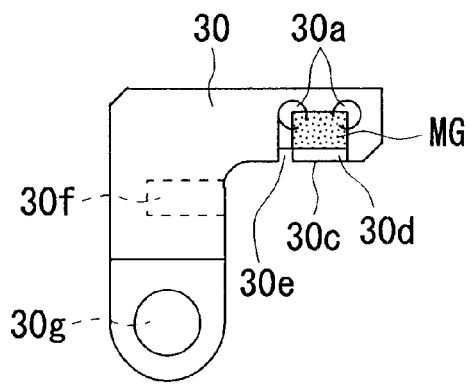
FIGS. 31A to 31C are a top view, a left side view, and a partially-exploded rear view showing the component stopper respectively.
Figure 31:
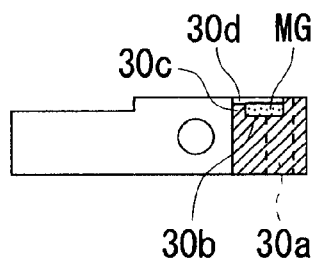
Figure 31:
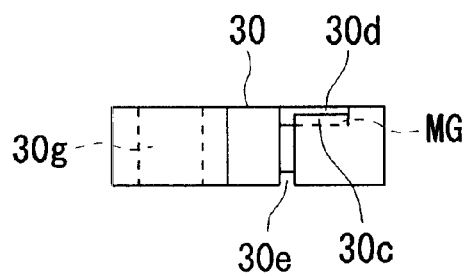
Figure 32:
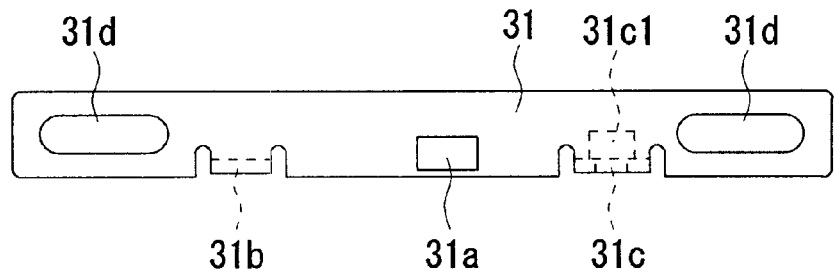
FIGS. 32A and 32B are a top view and a left side view showing the movable shutter respectively.
Figure 32:
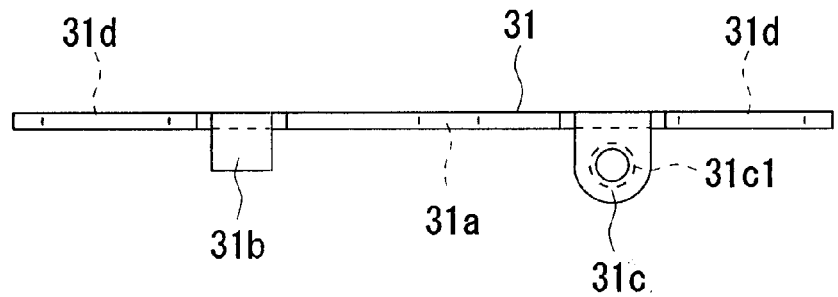
Figure 33:
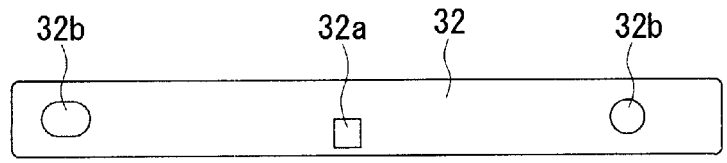
FIGS. 33A and 33B are a top view and a left side view showing the fixed shutter respectively.
Figure 33:
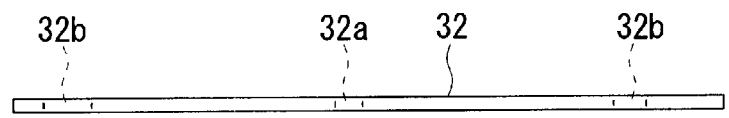
Figure 34:
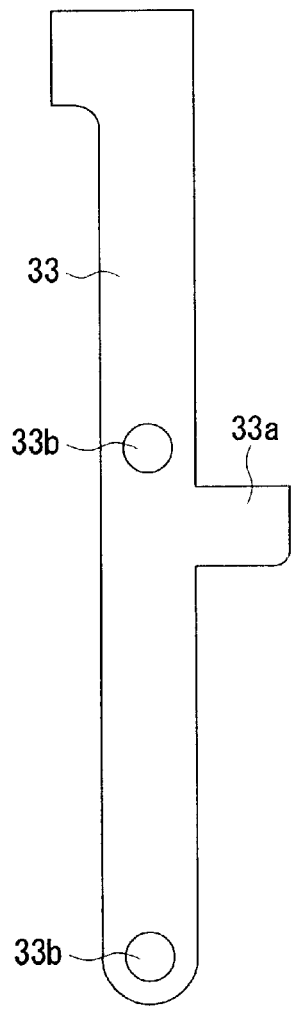
FIGS. 34A to 34D are a left side view showing the operating lever, a left side view showing a first link, a left side view showing a third link, and a left side view showing a fourth link respectively.
Figure 34:
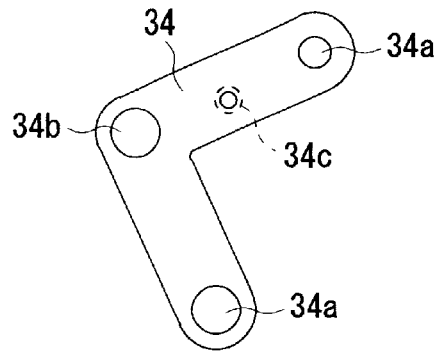
Figure 34:
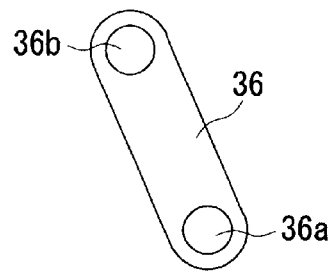
Figure 34:
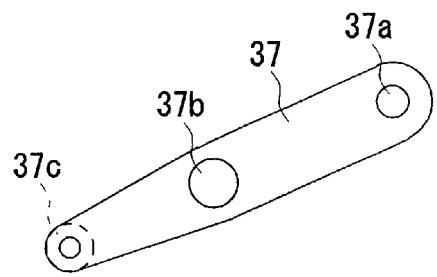
Figure 35:
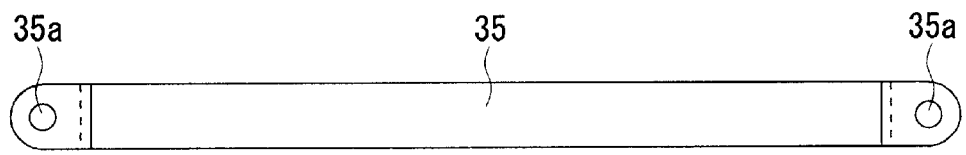
FIGS. 35A and 35B are left side views showing a second link and a fifth link respectively.
Figure 35:
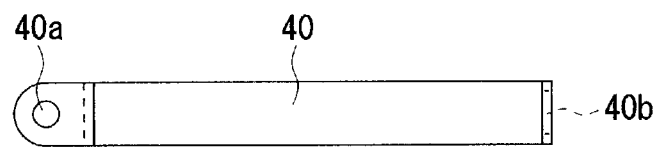
Figure 36:
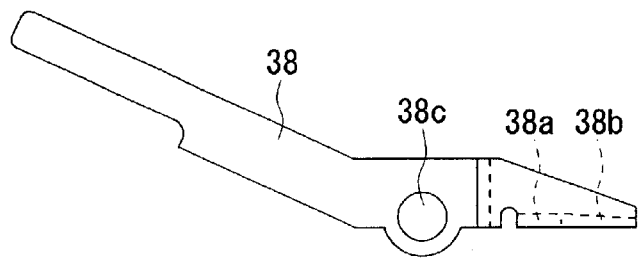
FIG. 36 is a left side view showing a first driving lever.
Figure 37:
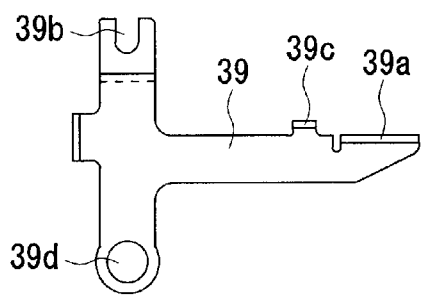
FIG. 37 is a left side view showing a second driving lever.

FIG. 23 is a left side view showing an electronic component feeding apparatus, FIG. 24 is a partially-enlarged longitudinal sectional view showing the apparatus shown in FIG. 23, FIG. 25 is a partially-enlarged longitudinal sectional view showing a component passage of a first component guide portion of the apparatus shown in FIG. 23, FIG. 26 is a partially-enlarged top view showing the apparatus shown in FIG. 23, FIG. 27 is a view obtained by excluding a fixed shutter and a supporting shaft from FIG. 26, FIG. 28 is a view obtained by excluding a movable shutter from FIG. 27, FIG. 29 is a view obtained by excluding a component stopper and a supporting shaft from FIG. 28, FIG. 30 is a sectional view taken on a line B—B of FIG. 29, FIGS. 31A to 31C are a top view, a left side view, and a partially-exploded rear view showing the component stopper respectively, FIGS. 32A and 32B are a top view and a left side view showing the movable shutter respectively, FIGS. 33A and 33B are a top view and a left side view showing the fixed shutter respectively, FIGS. 34A to 34D are a left side view showing the operating lever, a left side view showing a first link, a left side view showing a third link, and a left side view showing a fourth link respectively, FIGS. 35A and 35B are left side views showing a second link and a fifth link respectively, FIG. 36 is a left side view showing a first driving lever, FIG. 37 is a left side view showing a second driving lever, FIGS. 38A and 38B are a top view and a longitudinal sectional view showing a manifold respectively, and FIGS. 39 to 47 are explanatory views illustrating an operation of the apparatus shown in FIG. 23.

In those drawings, reference numeral 21 denotes a frame; 22, a storage unit; 23, a fixed pipe; 24, a movable pipe; 25, a pipe holder; 26, a first component guide; 27, a first cover for the first component guide; 28, a second component guide; 29, a second cover for the second component guide; 30, a component stopper; 31, a movable shutter; 32, a fixed shutter; 33, an operating lever; 34, a first link; 35, a second link; 36, a third link; 37, a fourth link; 38, a first driving lever; 39, a second driving lever; 40, a fifth link; 41, an air cylinder; 42, a control valve; and 43, an air tube.

The frame 21 is formed by shaping, by means of flexing or the like, a plate material obtained by stamping a metallic plate of stainless steel or the like in a predetermined shape. In the frame 21 shown in the drawing, each of the lower end edge and the rear end edge is provided with a bent portion for improving the frame stiffness, but these bent portions are not always required. The frame 21 is formed with a slit 21a for allowing a coupling portion of the second link 35 to move back and forth, and on the left side surface of the frame 21, there is provided a first stopper 21b for stipulating a return position of the operating lever 33.

The storage unit 22 has a storeroom 22a having a smaller dimension along the lateral direction than a dimension along the back-and-forth direction, and having a substantially V-character-shaped inclined bottom surface. On the top of the storage unit 22, there are provided a replenish port 22b for replenishing components into the storeroom 22a, and a slide cover 22c for opening or closing this replenish port 22b. Also, at the deepest recess of the storeroom 22a, there is formed a circular port 22d so as to penetrate, and a substantially-cylindrical bushing 22e is fitted in this circular hole 22d. The bushing 22e has a cone-shaped guide surface 22e 1 at the top end, has, at the center, an inner hole 22e2 having a slightly smaller circular cross section than an upper outside diameter of the movable pipe 24, and has an annular concave portion 22e3 for housing an upper part of a first coiled spring CS11, and a collar 22e4 for stipulating a fitting-in position on the circular hole 22d at the lower part. In the storage unit 22, at least the left side portion is constructed by a transparent component in such a manner that a quantity of stored components can be confirmed from outside. Also, the storage unit 22 is detachably mounted to the frame 21 by means of setscrews.

Within the storeroom 22a, a multiplicity of electronic components EC having such a square pillar shape as shown in FIG. 2A are housed in a bulk state. These electronic components EC are chip components such as, for example, chip condensers, chip inductors and chip resistors, and have external electrodes ECa at both ends in the lengthwise direction. The electronic component EC shown in FIG. 2A has dimensional relationship of length>width=height, and it is also possible to handle the electronic component EC having such dimensional relationship of length>width>height as shown in FIG. 2B.

The fixed pipe 23 is constructed by circular pipe material of predetermined length made of metal, hard resin or the like, and has an inner hole having a circular cross section at the center. The shape of the cross section of the inner hole in the fixed pipe 23 is slightly larger than length of a diagonal line of the end surface of the electronic component EC so that the electronic component EC can be caused to fall down by gravity in the lengthwise direction. This fixed pipe 23 is inserted at its lower end portion into a pipe mounting hole of the first component guide 26 through a pinching slit 25a of the pipe holder 25. The pipe holder 25 is secured to the first component guide 26 by screws, and a clearance in the pinching slit 25a is narrowed by a screwing operation, whereby the fixed pipe 23 can be held. The upper end of the fixed pipe 23 is at a slightly lower position than the upper end of the bushing 22e,but may be at a position which coincides with the upper end of the bushing 22e,or at a slightly higher position than the upper end thereof.

The movable pipe 24 portion other than the bushing 24d is made of metal, hard resin or the like, and the movable pipe 24 has a cone-shaped guide surface 24a at the top end, and has, at the center, an inner hole 24b having a slightly larger circular cross section than the outside diameter of the fixed pipe 23. Also, inside the lower part of the movable pipe 24, there is formed a bushing mounting hole 24c, and in this hole 24c, there is mounted a bushing 24d made of non-lubricated resin or the like in order to reduce kinetic frictional resistance between the fixed pipe 23 and the hole 24c. Further, on the external surface of the movable pipe 24, there are formed a first collar 24e and a second collar 24f, and the outside diameter of an upper side portion of the first collar 24e of the movable pipe 24 is slightly smaller than the inside diameter of the inner hole 22e2 of the bushing 22e. This movable pipe 24 is arranged in annular space between the bushing 22e and the fixed pipe 23 in such a manner as to be movable vertically. Also, between the bushing 22e and the first collar 24e, there is interposed a first coiled spring CS11, between the first collar 24e and the second collar 24f, there is interposed a second coiled spring CS12, and between the second coiled spring CS12 and the second collar 24f, there is inserted an U-character-shaped engaging groove 38b of the first driving lever 38. The movable pipe 24 is biased downward by the first coiled spring CS11 so that the top end of the movable pipe 24 in a standby state is located at a lower position than the top end of the fixed pipe 23. In the drawings, there has been exemplified a movable pipe in which force relationship between the first coiled spring CS11 and the second coiled spring CS12 is set to CS11<CS12, but the force relationship between the first coiled spring CS11 and the second coiled spring CS12 may be CS11=CS12 or CS11>CS12.

A first component guide 26 has, as shown in FIG. 24, a groove 26a for a pipe mounting hole, and a component passage groove 26b connected thereto on the left side, and is secured to the left side of the frame 21 by screws. The groove 26b consists of a curved portion and a long-sideways portion, and has a slightly larger rectangular cross section than a shape of an end surface of the electronic component EC. Also, an aperture edge of the long-sideways portion of the groove 26b is formed with an air auxiliary passage groove 26c being shallower than the groove 26b from the front end thereof to the end portion of the curved portion. On the left side of the first component guide 26, a transparent first cover 27 is detachably secured by screws so as to block respective side apertures for the groove 26a for a pipe mounting hole, the component passage groove 26b and the air auxiliary passage groove 26c. More specifically, the groove 26a for a pipe mounting hole is blocked at its side aperture by the first cover 27, whereby the groove serves as the pipe mounting hole, and as shown in FIG. 25, the component passage groove 26b is blocked at its side aperture by the first cover 27, whereby the component passage groove 26b serves as the component passage (hereinafter, the same symbol 26b as the groove 26b will be cited). The air auxiliary passage groove 26c is blocked at its side aperture by the first cover 27, whereby the air auxiliary passage groove 26c serves as the air auxiliary passage (hereinafter, the same symbol 26c as the groove 26c will be cited).

A second component guide 28 has, as shown in FIGS. 28 and 29, a component passage groove 28a on the top surface, and is secured to the left side of the frame 21 by screws in such a manner that the groove 28a is continuous to the above-described component passage 26b without any difference in level. The groove 28a consists of a long-sideways portion and a curved portion, and has a slightly larger rectangular cross section than a shape of an end surface of the electronic component EC. Also, aperture edges of the long-sideways portion and the curved portion of the groove 28a are formed with an air auxiliary passage groove 28b being shallower than the groove 28a from the front end thereof to the rear end in such a manner that it communicates to the above-described air auxiliary passage 26b. As shown in FIGS. 26 and 27, on the nearly left half of the top surface of the second component guide 28, a transparent second cover 29 is detachably secured by a setscrew FS so as to block top surface apertures other than tip end portions of the component passage groove 28a and the air auxiliary passage groove 28b. In other words, the component passage groove 28a is blocked at the top surface apertures other than tip end portions by the second cover 29 as shown in FIGS. 26, 27 and 30, whereby the component passage groove 28a serves as the component passage (hereinafter, the same symbol 28a as the groove 28a will be cited), and the air auxiliary passage groove 28b is blocked at the top surface apertures other than tip end portions by the second cover 29, whereby the air auxiliary passage groove 28b serves as the air auxiliary passage (hereinafter, the same symbol 28b as the groove 28b will be cited).

Also, on the top surface of the second component guide 28, there is formed a concave portion 28c for housing the component stopper. This concave portion 28c has such a shape of top surface as shown in FIG. 29, and the component passage groove 28a and the air auxiliary passage groove 28b are extendedly provided to the left side of a rear-side narrow portion of the concave portion 28c. The depth of the concave portion 28c is slightly larger than the thickness of the component stopper 30, and a base of the rear-side narrow portion is formed with an air flow port 28d so as to penetrate, and on the base of a wide portion of the concave portion 28c, there is formed a tapped hole 28e for mounting the supporting shaft SS11. Further, behind the concave portion 28c of the second component guide 28, there is formed a slit 28f, so as to penetrate, for allowing a U-character-shaped engaging portion 39b of the second operating lever 39 to move back and forth. Further, on the top surface of the second component guide 28, there are formed a tapped hole 28g for mounting the shutter supporting shaft SS12 and a tapped hole 28h for mounting a setscrew FS for the second cover. Also, on the underside of the air flow port 28d, there is formed a concave portion 28i for mounting a manifold 44.

The component stopper 30 has such a shape of top surface as shown in FIG. 31A, and predetermined thickness. As can be also seen from FIGS. 31B and 31C, in the rear end portion of the component stopper 30, air flow ports 30a having a circular cross section are formed at a predetermined interval so as to penetrate, and between two air flow ports 30a, there is formed a concave portion 30b so as to overlap about a quarter of each air flow port 30a. To this concave portion 30b, a permanent magnet MG made of samarium-cobalt magnet or the like is fixed such that one of N-pole or S-pole is opposite to an attraction wall 30c. The thickness of the permanent magnet MG is smaller than the depth of the concave portion 30b, and the height of the top surface of the attraction wall 30c coincides with that of this permanent magnet MG. More specifically, on the upper side of the permanent magnet MG and the attraction wall 30c, there is formed an air flow channel 30d for communicating to the top portions of two air flow ports 30a while the top surface of the component stopper 30 is covered with the movable shutter 31, and in the component stopper 30, there is constituted an air suction path capable of communicating to the tip end of the component passage 28a by means of the air flow port 30a and the air flow channel 30d. Also, the attraction wall 30c is formed with a groove 30e for connecting the top end aperture to the lower end aperture of the front-side air flow port 30a. Further, on the back surface of the front portion of the component stopper 30, there is formed a hole 30f for housing a third coiled spring CS13, and in the left end portion of the front portion 30 thereof, there is formed a hole 30g, through which the supporting shaft SS11 is inserted. After the third coiled spring CS13 is mounted in the hole 30f as shown in FIG. 28, the supporting shaft SS11 inserted through the hole 30g is mounted into the tapped hole 28e of the second component guide 28, whereby this component stopper 30 is arranged within the concave portion 28c of the second component guide 28. The component stopper 30 rotatably supported by the supporting shaft SS11 is biased in anti-clockwise direction by means of the third coiled spring CS13, but since it is pressed backward by means of the first protrusion 31b of the movable shutter 31 in a stand-by state, the attraction wall 30c is in contact with the left side of the rear-side narrow portion of the concave portion 38c.

The movable shutter 31 has such a shape of top surface as shown in FIG. 32A, and predetermined thickness. As can be also seen from FIG. 32B, on the left side at a substantially central portion of the movable shutter 31, there is formed a component outlet port 31a capable of opening the tip end portions of the component passage groove 28a and the air auxiliary passage groove 28b. Also, on the front side of the component outlet port 31a of the movable shutter 31, there is provided a first protrusion 31b constructed by bending a protruded piece downward. Further, behind the component outlet port 31a of the movable shutter 31, there is provided a second protrusion 31c constructed by bending a protruded piece downward, and inside this second protrusion 31c, there is provided a roller 31c1. At the front and rear ends of the movable shutter 31, there is respectively formed a guide hole 31d, through which the supporting shaft SS12 is inserted.

The fixed shutter 32 has such a shape of top surface as shown in FIG. 33A, and predetermined thickness. As can be also seen from FIG. 33B, on the left side at a substantially central portion of the fixed shutter 32, there is formed a component outlet port 32a, which positionally coincides with each of the tip end portions of the component passage groove 28a and the air auxiliary passage groove 28b. Also, at the front and rear ends of the fixed shutter 32, there is respectively formed a positioning hole 32b, through which the supporting shaft SS12 is inserted.

In a state in which the fixed shutter 33 is superimposed on the movable shutter 31 such that the guide hole 31d and the positioning hole 32b coincide with each other as shown in FIG. 26, the supporting shaft SS12 inserted through the front-side guide hole 31d and the positioning hole 32b, and the supporting shaft SS12 inserted through the rear-side guide hole 31d and the positioning hole 32b are mounted into tapped holes 28g in the second component guide 28, whereby the movable shutter 31 and the fixed shutter 32 are arranged on the top surface of the second component guide 28 so as to block nearly right half of the top surface aperture of the concave portion 28c, the top surface aperture of the slit 28f, and the tip end portion of the component passage groove 28a and the air auxiliary passage groove 28b. At this time, the first protrusion 31b of the movable shutter 31 is inserted into the front-side narrow portion of the concave portion 28c, and the second protrusion 31c is inserted into the slit 28f In other words, the tip end portion of the component passage groove 28a is blocked at its top surface aperture by the movable shutter 31, whereby the tip end portion of the component passage groove 28a serves as the component passage (hereinafter, the same symbol 28a as the groove 28a will be cited), and the tip end portion of the air auxiliary passage groove 28b is blocked at its top surface aperture by the movable shutter 31, whereby the tip end portion of the air auxiliary passage groove 28b serves as the air auxiliary passage (hereinafter, the same symbol 28b as the groove 28b will be cited). The fixed shutter 32 located above the movable shutter 31 is in a fixed state because the movement in the back-and-forth direction is restricted by two supporting shafts SS12, but the movable shutter 31 is capable of moving in the back-and-forth direction while being regulated in direction by means of those two supporting shafts SS12. The component outlet port 32a of the fixed shutter 32 in the stand-by state coincides with the tip end portions of the component passage 28a and the air auxiliary passage 28b, but the component outlet port 31a of the movable shutter 31 in the stand-by state is deviated backward from the tip end portions of the component passage 28a and the air auxiliary passage 28b.

The operating lever 33 has such a shape of left side as shown in FIG. 34A, and predetermined thickness. On the rear side at the center of the operating lever 33, there is formed a protrusion 33a capable of abutting on the first stopper 21b of the frame 21, and there are formed coupling holes 33b at the center and in the lower part.

The first link 34 has such a shape of left side as shown in FIG. 34B, and predetermined thickness. At both ends of the first link, which form a L-character shape, there is formed a coupling hole 34a, and at the bent portion, there is formed a hole 34b, through which the supporting shaft SS13 is inserted. Also, on the right side between the coupling hole 34a formed at the upper end portion of the first link 34 and the hole 34b, there is provided a roller 34c.

The second link 35 has such a shape of left side as shown in FIG. 35A, and predetermined thickness. The second link 35 is formed by bending the front and rear end portions in the direction of the length, and each bent portion is formed with a coupling hole 35a.

The third link 36 has such a shape of left side as shown in FIG. 34C, and predetermined thickness. At the lower end portion of the third link 36, there is formed a coupling hole 36a, and at the top end portion, there is formed a hole 36b, through which the supporting shaft SS14 is inserted.

The fourth link 37 has such a shape of left side as shown in FIG. 34D, and predetermined thickness. At the top end portion of the fourth link 37, there is formed a coupling hole 37a, and at the substantially central portion, there is formed a hole 37b, through which the supporting shaft SS15 is inserted. Also, at the lower end portion of the fourth link 37, there is provided a roller 37c.

The description will be made of coupling structure between the operating lever 33 and the first link 34 to the fourth link 37. As shown in FIG. 23, to the upper coupling hole 33b of the operating lever 33, the upper coupling hole 34a of the first link 34 is rotatably coupled, and the supporting shaft SS13 inserted through the hole 34b is mounted in a tapped hole (not shown) of the frame 21, whereby the first link 34 is arranged on the side of the left side of the frame 21. To the lower coupling hole 34a of the first link 34, the front-side coupling hole 35a of the second link 35 arranged on the side of the right side of the frame 21 is rotatably coupled, and to the rear-side coupling hole 35a of the second link 35, the coupling hole of the third link 36 is rotatably coupled. The supporting shaft SS14 inserted through the hole 36b is mounted to a tapped hole (not shown) of the frame 21, whereby the third link 36 is arranged on the side of the left side of the frame 21. To the lower coupling hole 33b of the operating lever 33, the coupling hole 37a of the fourth link 37 is rotatably coupled, and the supporting shaft SS15 inserted through the hole 37b is mounted to the tapped hole (not shown) of the frame 21, whereby the fourth link 37 is arranged on the side of the left side of the frame 21.

The first driving lever 38 has such a shape of left side as shown in FIG. 36, and predetermined thickness. In the rear portion of the first driving lever 38, a 90° bent plate-shaped portion 38a is integrally formed, and at the rear end portion of the plate-shaped portion 38a, there is formed a U-character-shaped engaging portion 38b. Also, the bent portion of the first driving lever 38 is formed with a hole 38c, through which the supporting shaft SS16 is inserted. As shown in FIG. 23, the supporting shaft SS16 inserted through the hole 38c is mounted in a tapped hole (not shown) in the frame 21, whereby this first driving lever 38 is arranged on the side of the left side of the frame 21. The engaging portion 38b of the first driving lever 38 rotatably supported by the supporting shaft SS16 is inserted between the second coiled spring CS12 and the second collar 24f, and the first driving lever 38 is biased in clockwise direction by means of the first coiled spring CS11 so that its front end is located in contact with or in non-contact with the underside of the roller 34c of the first link 34.

The second driving lever 39 has such a shape of left side as shown in FIG. 37, and predetermined thickness. At the rear end portion of the second driving lever 39, there is integrally formed a 90° bent plate-shaped portion 39a, and at the top end portion, there is formed a U-character-shaped engaging portion 39b. Also, on the front side of the plate-shaped portion 39a of the second driving lever 39, there is formed a protrusion 39c for engaging with one end of the fourth coiled spring CS14, and at the lower end portion, there is formed a hole 39d, through which the supporting shaft SS17 is inserted. As shown in FIG. 23, the supporting shaft SS17 inserted through the hole 39d is mounted in a tapped hole (not shown) of the frame 21, and the fourth coiled spring CS14 is extended between the protrusion 39c and the frame 21, whereby this second driving lever 39 is arranged on the side of the left side of the frame 21. As can be seen from FIGS. 26 to 29, the engaging portion 39b of the second driving lever 39 is inserted into the slit 28f of the second component guide 28 from the underside, and the engaging portion 39b engages with the roller 31c1 of the second protrusion 31c of the movable shaft 31. The second driving lever 39 rotatably supported by the supporting shaft SS17 is biased in clockwise direction by means of the fourth coiled spring CS14 so that in a stand-by state, the movable shutter 31, whose roller 31c1 engages with the engaging portion 39b of the second driving lever 39, moves backward, and the first protrusion 31b of this movable shutter 31 presses the component stopper 30 backward so that the attraction wall 30c of the component stopper 30 is contact with the left side of the rear-side narrow portion of the concave portion 38c.

The fifth link 40 has a coupling hole 40a at the front end portion, and a coupling hole 40b at the rear-end bent portion. This fifth link 40 has the front-side coupling hole 40a rotatably coupled to the rear-side coupling hole 35a of the second link 35 on the rear on the back surface side of the frame 21, and the rear-side coupling hole 40b is mounted to the rod 41a of the air cylinder 41.

An air cylinder 41 is of a double-acting type having two air supply/release ports, and is rotatably supported at its rear end portion by means of the supporting shafts SS18 mounted in tapped holes (not shown) in the frame 21. The rod 41a of the air cylinder 41 is mounted at its tip end with a spring hook 41b, and between this spring hook 41b and the frame 21, there is adjusted a fifth coiled spring 15. This fifth coiled spring CS15 plays a role to return the rod 41*a* to a retract position, and plays a role to draw the second link 35 backward through the fifth link 40 to thereby bias the first link 34 and the third link 36 in anti-clockwise direction, and to bias the operating lever 33 upward by means of this first link 34 to cause its protrusion 33*a* to abut on the first stopper 21*b*.

Also, to one air supply/release port of the air cylinder 41, there is connected a control valve 42 for diverging into an air suction port and an air release port. Particularly, the air cylinder 41 has such valve structure that as valve symbols are shown in FIG. 23, when the rod 41*a* advances, the back side of the control valve 42 serves as the air release port, and when the rod 41*a* retracts from the advance position, the front side of the control valve 42 serves as the air suction port. Incidentally, the other air supply/release port of the air cylinder 41 is open to the open air.

Figure 38:
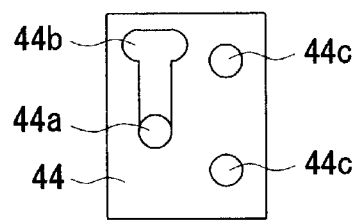
FIGS. 38A and 38B are a top view and a longitudinal sectional view showing a manifold respectively.
Figure 38:
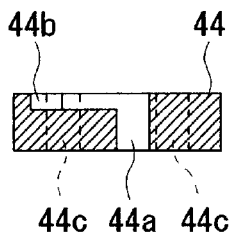

An air tube 43 is, at its one end, connected to the air suction port of the control valve 42, while it is connected at the other end to a connecting hole 44*a* of a manifold 44 through an adequate connection fitting. Incidentally, the manifold 44 has such a shape of top surface as shown in FIG. 38, and is secured to the concave portion 28*i* of the second component guide 28 by screws as shown in FIG. 30. This manifold 44 has a groove 44*b* communicating to the connecting hole 44*a*, and a thread inserting hole 44*c*, and the shape of the wide portion of the groove 44*b* substantially coincides with that of air flow port 28*d* of the second component guide 28. In other words, on the air flow port 28*d* of the second component guide 28, an air suction force acts only when the rod 41*a* of the air cylinder 41 retracts.

Hereinafter, with reference to FIGS. 39 to 47, and FIG. 22 used in the first embodiment, the description will be made of an operation of an apparatus according to the second embodiment.

Figure 39:
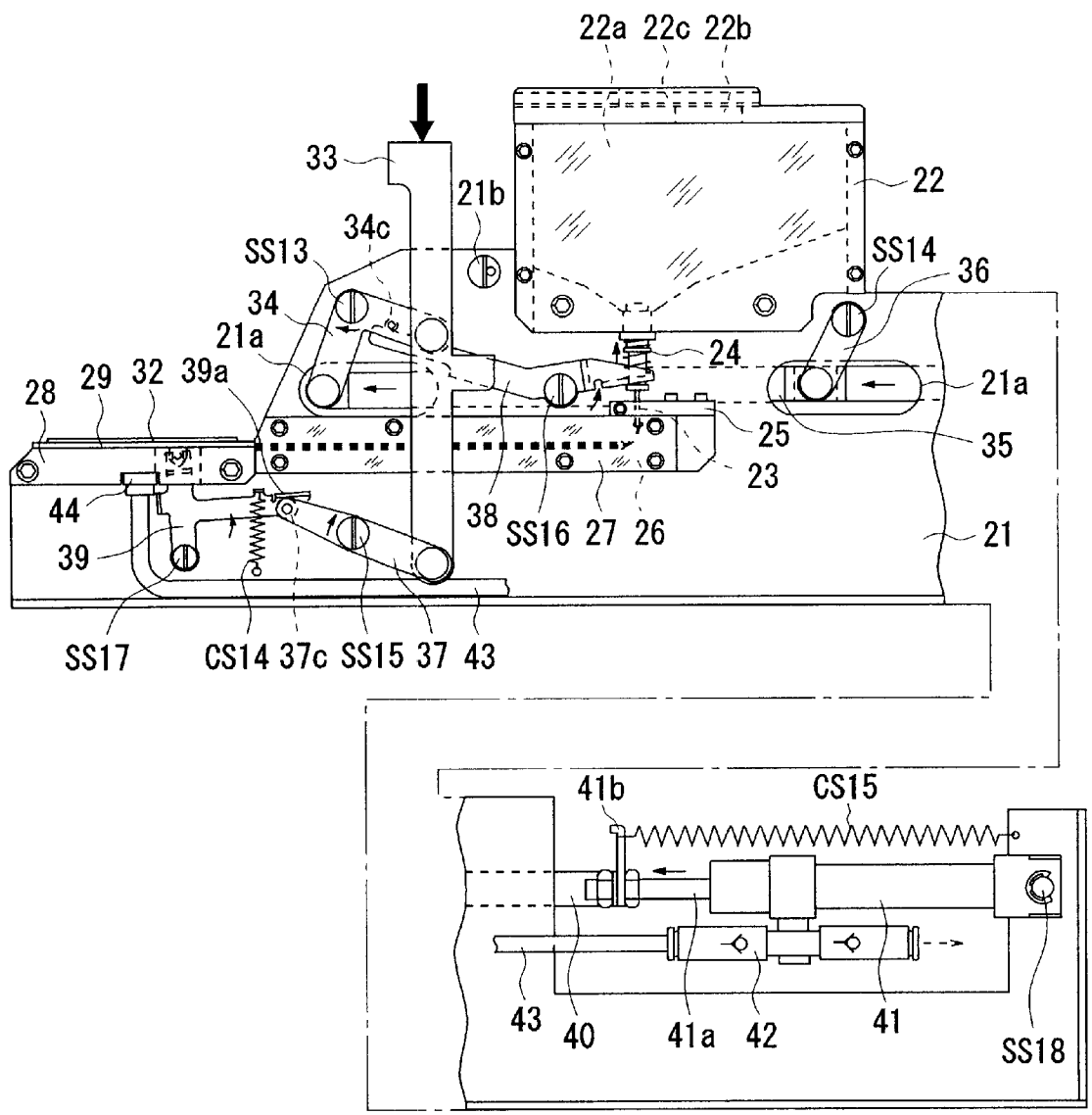
FIG. 39 is an explanatory view illustrating an operation of the apparatus shown in FIG. 23.
Figure 40:
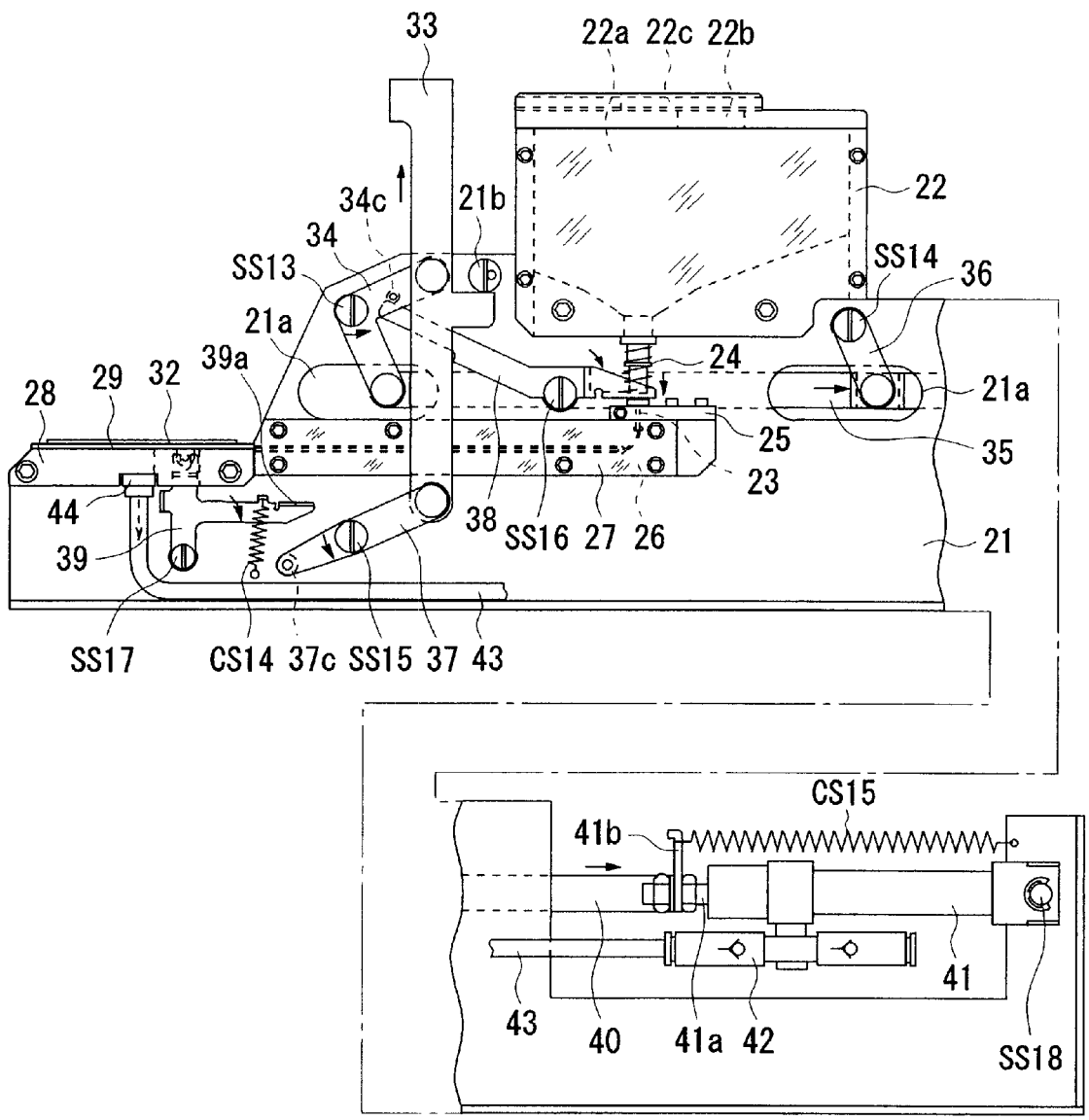
FIG. 40 is an explanatory view illustrating an operation of the apparatus shown in FIG. 23.

The apparatus according to the second embodiment repeats such an operation as to depress the top end of the operating lever 33 from the stand-by state shown in FIG. 23 by a predetermined stroke, and thereafter to return the operating lever 33 to the original state as shown in FIGS. 39 and 40, at a predetermined cycle (See symbol tt in FIG. 22), for example, at about 0.1 second to thereby perform intended component supply.

When the top end of the operating lever 33 is depressed, the first link 34 coupled to the operating lever 33 rotates in clockwise direction as shown in FIG. 39, and the roller 34*c* of the first link 34 presses the front end of the first driving lever 38 downward so that the first driving lever 38 rotates in anti-clockwise direction, and the fourth link 37 coupled to the operating lever 33 rotates in clockwise direction.

Figure 41:
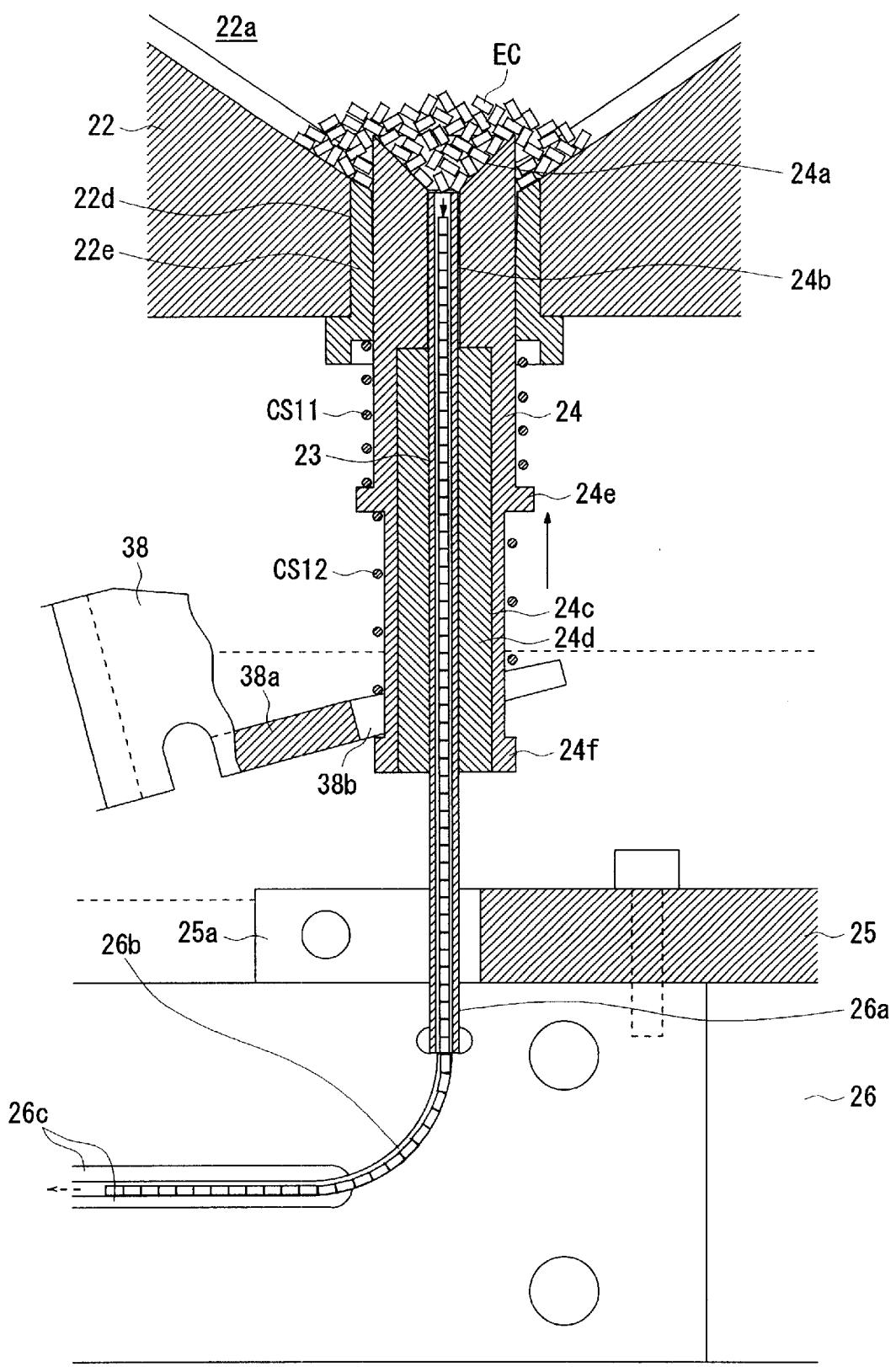
FIG. 41 is an explanatory view illustrating an operation of the apparatus shown in FIG. 23.

When the first driving lever 38 rotates in anti-clockwise direction, the movable pipe 24 rises by a predetermined stroke while the first coiled spring CS11 is being compressed, and this rise of the movable pipe 24 raises electronic components EC located above the movable pipe 24 upwardly as shown in FIG. 41 so that the electronic components EC within the storeroom 22*a* are subjected to an agitating operation. Thereby, the stored components EC enter the top end of the inner hole of the fixed pipe 23 on a one-by-one basis in a lengthwise direction through the use of the inclined guide surface 24*a*, or directly. The electronic components EC, which have entered the inner hole of the fixed pipe 23, move downward within the inner hole by gravity to enter the component passage 26*b*, and when passing through the curved portion by gravity, their posture is changed from a vertical position to a horizontal position to enter the long-sideways portion. Since the curved portion and the long-sideways portion of the component passage 26*b* have both a rectangular cross section, the orientations of four sides except for both end surfaces, in the longitudinal direction, of the electronic components EC are corrected mainly when passing through the curved portion, and substantially conform to the four inner surfaces of the component passage 26*b* when entering the long-sideways portion.

After a lapse of predetermined time (see a symbol ti of FIG. 22) from the commencement of the depressed top end of the operating lever 33, in other words, immediately before the depressing operation is completed, the roller 37*c* of the fourth link 37, which rotates in clockwise direction, comes into contact with the under surface of the plate-shaped portion 39*a* of the second driving lever 39, and thereafter, along with rotational displacement of the fourth link 37, the second driving lever 39 rotates in anti-clockwise direction against the biasing force of the fourth coiled spring CS 14.

Figure 42:
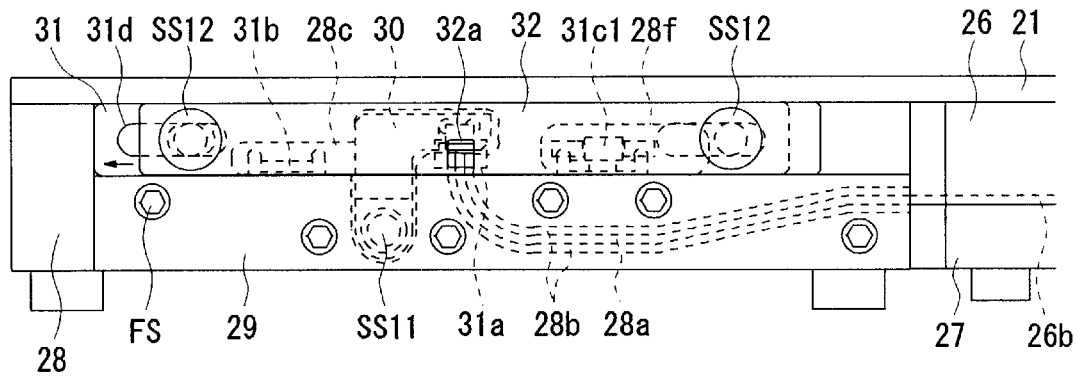
FIG. 42 is an explanatory view illustrating an operation of the apparatus shown in FIG. 23.
Figure 43:
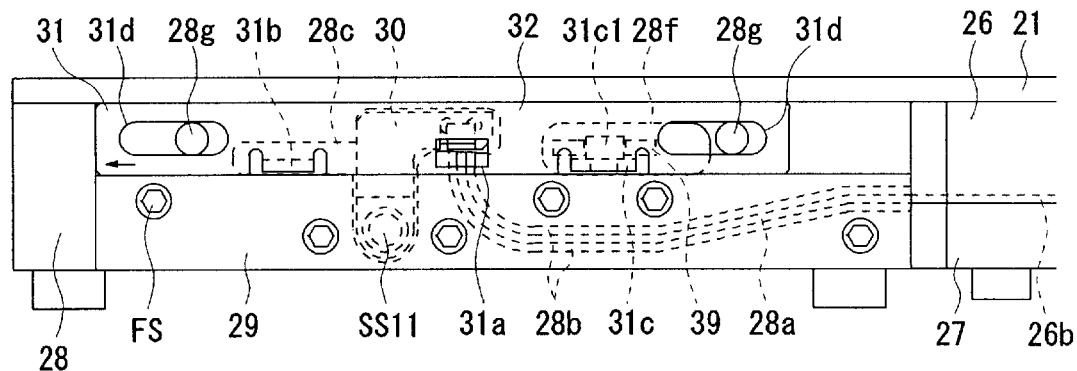
FIG. 43 is an explanatory view illustrating an operation of the apparatus shown in FIG. 23.

When the second driving lever 39 rotates in anti-clockwise direction, the engaging portion 39*b* of the second driving lever 39 presses the roller 31*c*1 forward to advance the movable shutter 31 by a predetermined stroke as shown in FIGS. 42 and 43. This advancement of the movable shutter 31 causes the component outlet port 31*a* of the movable shutter 31 to coincide with the tip end portions of the component passage 28*a* and the air auxiliary passage 28*b*, and the component outlet port 32*a* of the fixed shutter 32 so that the tip end portion of the component passage 28*a* is exposed through the both component outlet ports 31*a* and 32*a*.

Figure 44:
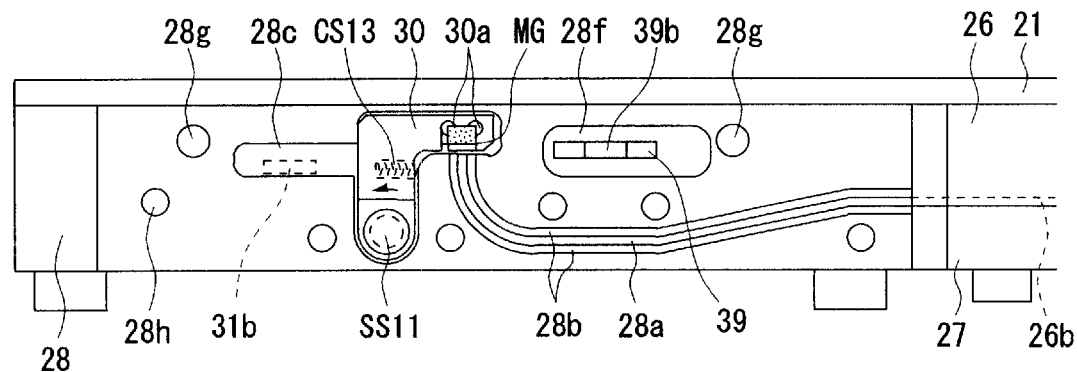
FIG. 44 is an explanatory view illustrating an operation of the apparatus shown in FIG. 23.
Figure 45:
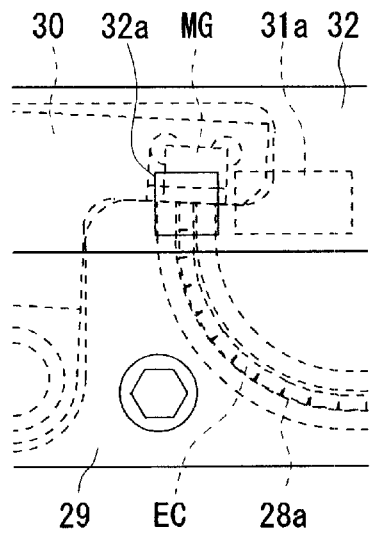
FIGS. 45A and 45B is explanatory views each illustrating an operation of the apparatus shown in FIG. 23.
Figure 45:
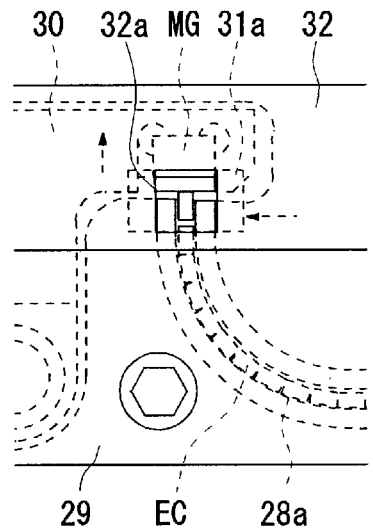
Figure 46:
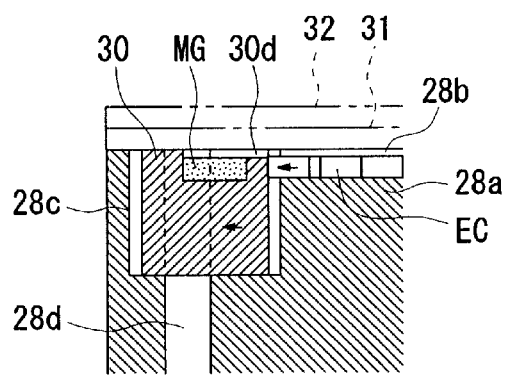
FIG. 46 is an explanatory view illustrating an operation of the apparatus shown in FIG. 23.
Figure 47:
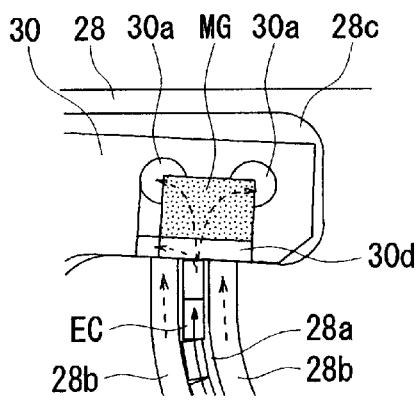
FIGS. 47A and 47B are explanatory views each illustrating an operation of the apparatus shown in FIG. 23.
Figure 47:
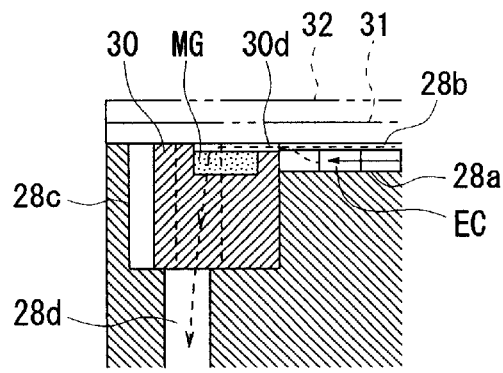
Figure 48:
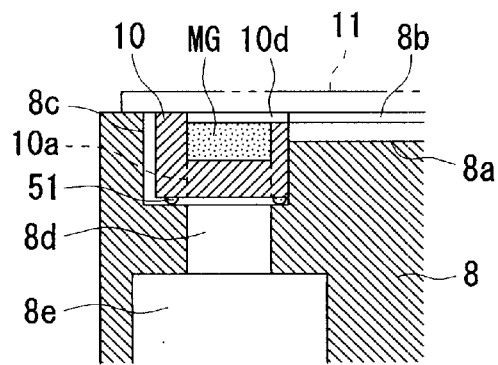
FIGS. 48A and 48B are views showing a variation of a component stopper according to the first and second embodiments respectively.
Figure 48:
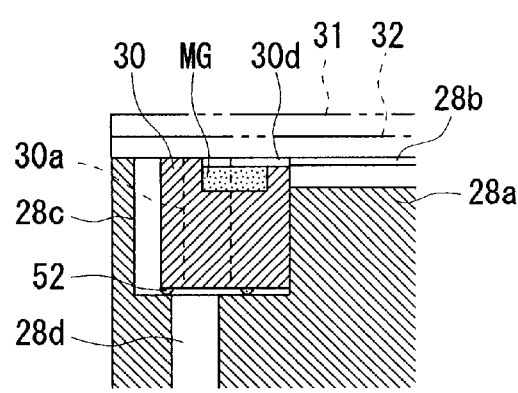
Figure 49:
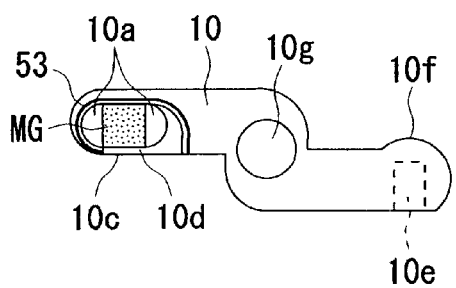
FIGS. 49A and 49B are views showing a variation of a component stopper according to the first and second embodiments respectively.
Figure 49:
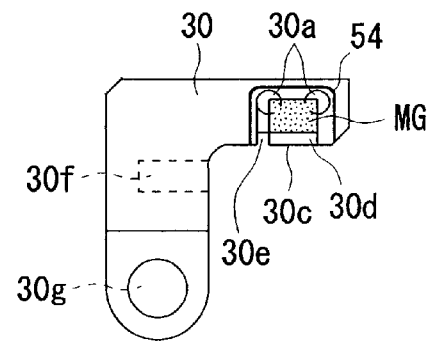
Figure 50:
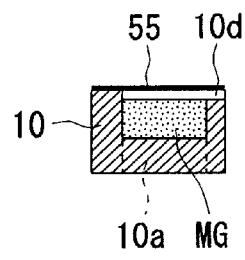
FIGS. 50A and 50B are views showing a variation of a component stopper according to the first and second embodiments respectively.
Figure 50:
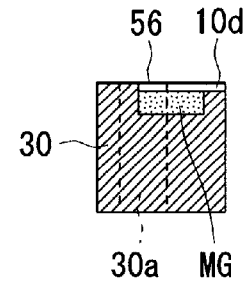
Figure 51:
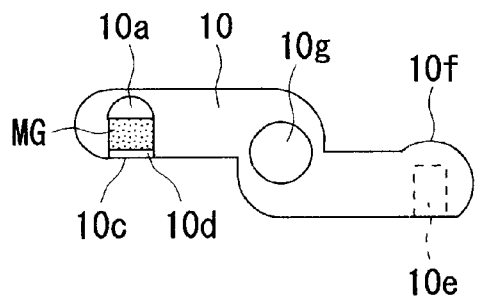
FIGS. 51A and 51B are views showing a variation of a component stopper according to the first embodiment respectively.
Figure 51:
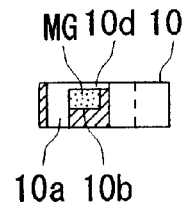
Figure 52:
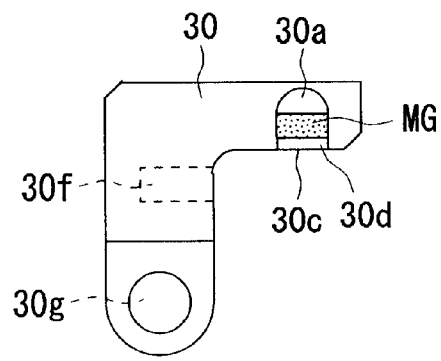
FIGS. 52A and 52B are views showing a variation of a component stopper according to the second embodiment respectively.
Figure 52:
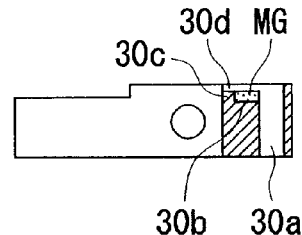
Figure 53:
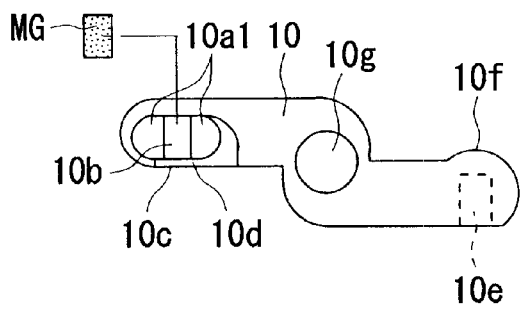
FIGS. 53A and 53B are views showing a variation of a component stopper according to the first and second embodiments respectively.
Figure 53:
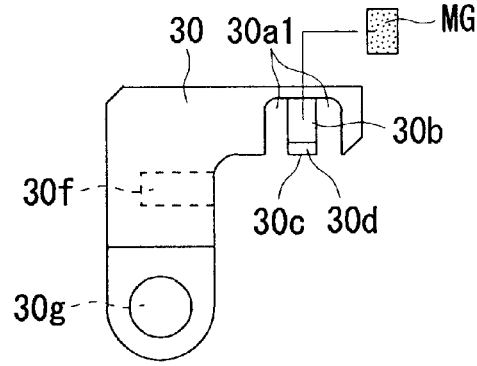
Figure 54:
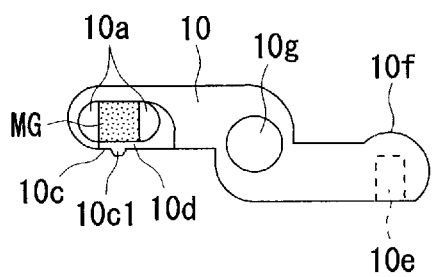
FIGS. 54A and 54B are views showing a variation of a component stopper according to the first and second embodiments respectively.
Figure 54:
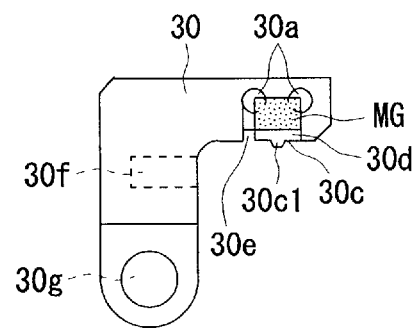
Figure 55:
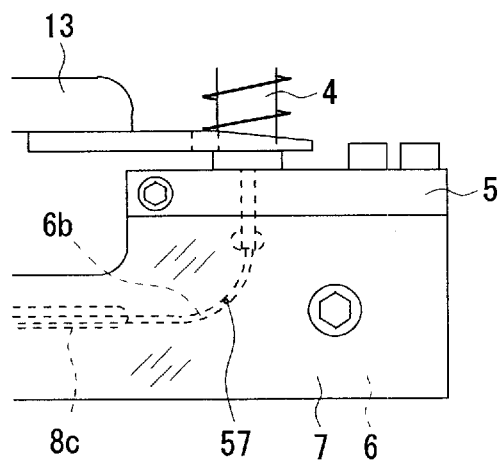
FIGS. 55A and 55B are views showing a variation of a rear-side component passage according to the first and second embodiments respectively.
Figure 55:
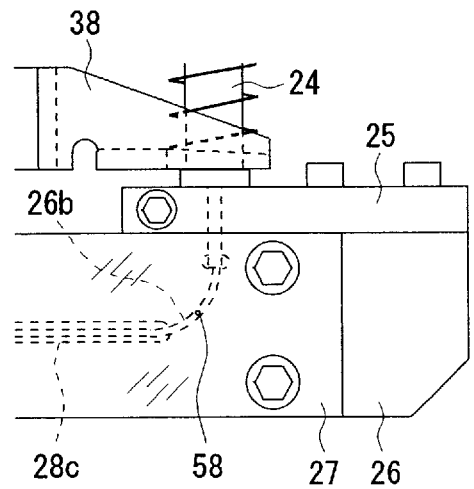
Figure 56:
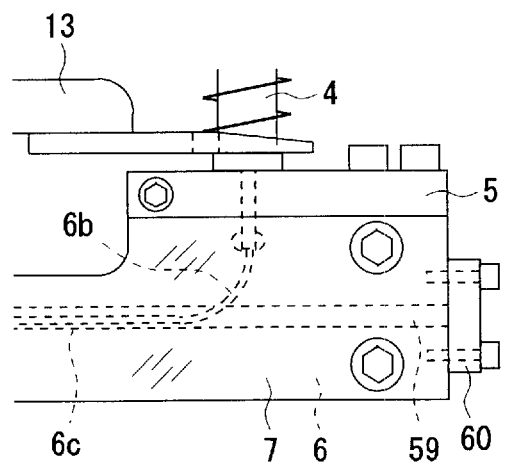
FIGS. 56A and 56B are views showing a variation of a rear-side component passage according to the first and second embodiments respectively.
Figure 56:
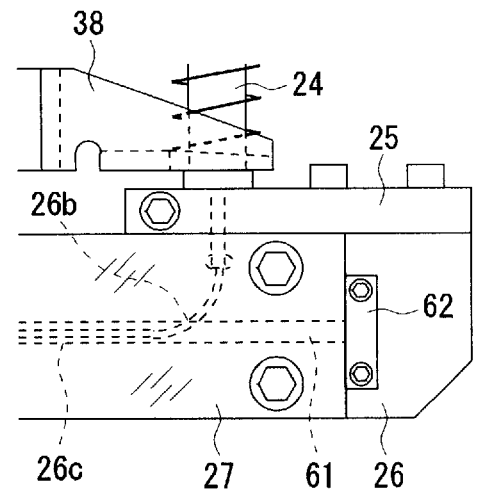

When the movable shutter 31 advances, the first protrusion 31*b* of the movable shutter 31 leaves the component stopper 30 forward as shown in FIG. 44, whereby the component stopper 30 rotates by a little angle, for example, about 3° in anti-clockwise direction by means of the biasing force of the third coiled spring CS13 so that the attraction wall 30*c* leaves the left side of the rear-side narrow portion of the concave portion 28*c*. When the foremost electronic component EC within the component passage 28*a* is attracted on the attraction wall 30*c* by means of a magnetic force of a permanent magnet MG as shown in FIG. 45A, the foremost electronic component EC slightly moves in the right direction together with the attraction wall 30*c* along with rotational displacement of the component stopper 30 as shown in FIGS. 45B and 46, whereby the foremost electronic component EC is separated from the succeeding components. Incidentally, time t2 of FIG. 22 is time required to take out the foremost electronic component EC from the component outlet ports 31*a* and 32*a* by means of an attraction nozzle or the like.

Also, when the top end of the operating lever 33 is depressed, the fifth link 40 moves forward through the second link 35 coupled to the first link 34 as shown in FIG. 39 in synchronization with the rotational displacement of the operating lever 33 to advance the rod 41*a* of the air cylinder 41 coupled to the fifth link 40 (See movement from POSITION 1 to POSITION 2 of FIG. 22). Since the rear side of the control valve 42 serves as the air release port at this time, air is released into the outside as indicated by an arrow of broken line as the rod 15*a* retracts.

On the other hand, after a lapse of predetermined time (see a symbol t2 of FIG. 22) from the completion of the depressed top end of the operating lever 33, the depressed top end of the operating lever 33 is released as shown in FIG. 40 so that the first link 34 returns to the original state by means of the biasing force of the fifth coiled spring CS15, and the operating lever 33 and the fourth link 37 also return to their original states.

When the first link 34 starts to return to its original state, the first driving lever 38 returns to its original state by means of the biasing force of the first coiled spring CS11 in synchronization therewith to lower the movable pipe 24 from the raised position by a predetermined stroke. This descent of the movable pipe 24 causes, as shown in FIG. 24, the electronic components EC located above the movable pipe 24 to lower so that electronic components EC within the storeroom 22a are subjected to the same agitating operation as described above. Thereby the stored components EC enter the top end of the inner hole of the fixed pipe 23 on a one-by-one basis in the lengthwise direction through the use of the inclined guide surface 24a, or directly. The electronic components EC, which have entered the inner hole of the fixed pipe 23, move downward within the inner hole by gravity to enter the component passage 26b, and at the time of passing through the curved portion by gravity, their posture is changed from a vertical position to a horizontal position to enter the long-sideways portion. Since the curved portion and the long-sideways portion of the component passage 26b have both a rectangular cross section, the orientations of four sides except for both end surfaces of the electronic components EC in the longitudinal direction are corrected mainly when passing through the curved portion, and substantially conform to the four inner surfaces of the component passage 26b when entering the long-sideways portion.

Also, when the fourth link 37 starts to return to its original state, the second driving lever rotates in clockwise direction in synchronization therewith by means of the biasing force of the fourth coiled spring CS14, and the engaging portion 39b of the second driving lever 39 presses the roller 31c1 backward to thereby retract the movable shutter 31 by a predetermined stroke. This retraction of the movable shutter 31 causes the component outlet port 31a of the movable shutter 31 to be deviated backward from the component outlet port 32a of the fixed shutter 32 as shown in FIG. 26, and the tip end portion of the component passage 28a is blocked again. Also, when the movable shutter 31 retracts, the first protrusion 31b of the movable shutter 31 presses the component stopper 30 backward to rotate in clockwise direction, and the attraction wall 30c comes into contact with the left side of the rear-side narrow portion of the concave portion 28c again.

Further, when the first link 34 returns to its original state, the fifth link 40 moves backward through the second link 35 coupled to the first link 34 in synchronization therewith, and the rod 41a of the air cylinder 41 coupled to the fifth link 40 retracts from the advance position(see movement of POSITION 2 to POSITION 1 of FIG. 22). Since the front side of the control valve 42 serves as the air suction port at this time, the air suction force acts on the air flow port 28d of the second component guide 28 through the air tube 43 and the manifold 44 along with the retraction of the rod 41a. The air flow port 28d of this second component guide 28 communicates to the tip end portions of the component passage 28a and the air auxiliary passage 28b through the air flow port 30a and the air flow channel 30d of the component stopper 30, and therefore, a flow of air toward the component stopper 30 occurs even in the component passage 28a, the air auxiliary passage 28b, a rear-side component passage 26b continuing to these, and the air auxiliary passage 26c as indicated by an arrow of broken line in FIGS. 47A and 47B.

This flow of air does not occur as soon as the rod 41a of the air cylinder 41 starts the retraction, but actually starts to occur immediately after the retraction of the rod 41a has been completed as shown in FIG. 22, and its flow rate shows such a curvilinear change that it slowly rises from zero value to reach the maximum value, and thereafter reduces to the zero value again. According to the flow of air shown in FIG. 22, a time range in which the flow of air is occurring is a range: from return of the operating lever 33 to the original state to immediately after depression of the top end of the operating lever 33 is started again, but within the same time range, advancement of the movable shutter 31 has not been started, but no impediment occurs in the operation because the tip end portions of the component passage 28a and the air auxiliary passage 28b are covered with the movable shutter 31.

When a flow of air toward the component stopper 30 occurs even in the component passage 28a, the air auxiliary passage 28b, a rear-side component passage 26b continuing to these, and the air auxiliary passage 26c, the electronic components EC, which have entered the long-sideways portion of the component passage 26b, move forward by means of the flow of air to enter the component passage 28a. Of the electronic components EC which have entered the component passage 28a, the foremost electronic component EC abuts on the attraction wall 30c of the component stopper 30 to be attracted to and held by the attraction wall 30c by means of the magnetic force of the permanent magnet MG.

After a lapse of predetermined time (See a symbol t3 of FIG. 22) from the completion of the return of the operating lever 33, the top end of the operating lever 33 is depressed by a predetermined stroke again to perform the same operation as described above. Incidentally, the time t3 of FIG. 22 is waiting time when the top end of the operating lever 33 returned is depressed again.

As described above, in the above-described apparatus, by utilizing such an operation as to return the operating lever 33 to its original state after the top end of the operating lever 33 is depressed by a predetermined stroke, the rod 41a of the air cylinder 41 is caused to advance and retract; through the use of the air suction force when the rod 41a retracts, a flow of air toward the component stopper 30 is caused to occur even in the component passage 28a, the air auxiliary passage 28b, a rear-side component passage 26b continuing to these, and the air auxiliary passage 26c; and through the use of this flow of air, the electronic components EC within the component passages 26b and 28a are caused to move forward still in the lined-up state, whereby it is possible to cause the foremost electronic component EC to abut on the attraction wall 30c of the component stopper 30. In other words, in addition to being able to precisely supply square pillar-shaped electronic components EC, it is possible to construct the apparatus itself simply at low cost, because such a belt and its moving mechanism, a large-sized suction source such as a vacuum pump, air piping from this suction source and the like as in the conventional case are not required in order to convey the components.

Also, the foremost electronic component EC within the component passage 28a can be attracted to and held by the attraction wall 30c of the component stopper 30 by means of the magnetic force of the permanent magnet MG, and yet when the tip end portion of the component passage 28a is exposed through the component outlet ports 31a and 32a of the movable shutter 31 and the fixed shutter 32, the foremost electronic component EC can be separated from the succeeding components by means of rotational displacement of the component stopper 30. Therefore, when the foremost electronic component EC is taken out of the component outlet ports 31a and 32a by means of the attraction nozzle or the like, it is possible to satisfactorily perform a component taking-out operation by preventing the electronic component EC to be taken out from interfering with the succeeding components.

Further, since the movable shutter 31 is caused to advance immediately before the depression of the top end of the operating lever 33 is completed, it is possible to reliably cover the tip end portions of the component passage 28a and the air auxiliary passage 28b with the movable shutter 31 when a flow of air is actually occurring in the component passages 28a and 26b, whereby it is possible to precisely execute component conveyance using air suction. Also, since the tip end portion of the component passage 28a can be exposed only during a duration corresponding to component taking-out, problems caused by the tip end portion of the component passage 28a to be unnecessarily exposed for many hours such as, for example, entry of dust and the like can be prevented.

Further, there is provided an air flow port 28d on the upper side of the groove 44b of the manifold 44, to which the air tube 43 has been connected, and this air flow port 28d communicates to the tip end portions of the component passage 28a and the air auxiliary passage 28b through the air flow port 30a of the component stopper 30 and the air flow channel 30d, and therefore, it is possible to construct a simple air suction route with low pressure loss and flow rate loss.

In this respect, in the above-described second embodiment, the double-acting type having two air supply/release ports was used as the air cylinder 41, the control valve 42 was connected to one air supply/release port and the other air supply/release port was opened to the open air. However, in order to prevent dust and the like from being sucked together with air into the air cylinder 41 from the other air supply/release port when the rod 41a advances, it may be possible to arrange a filter for the other air supply/release port. Also, when air is sucked into the control valve 42 through the air tube 43, in order to prevent dust and the like from being sucked within the control valve 42 and within the air cylinder 41 together with air, it may be possible to arrange a filter for the air suction port of the control valve 42. Of path, a single-acting type having a single air supply/release port may be used as the air cylinder 41.

Also, a sectional area ratio of the component passage 26b, 28a shown in the second embodiment described above to the air auxiliary passage 26c, 28b must be properly set when the components are conveyed by means of air suction. As a result of various experiments, a desirable sectional area ratio of an air auxiliary passage is 20 to 120 assuming the sectional area of the component passage to be 100. When the sectional area ratio of the air auxiliary passage is excessively low although it also depends upon the size of the electronic component EC to be handled, it becomes difficult to secure a sufficient flow of air to convey the components during air suction, and when the sectional area ratio of the air auxiliary passage is excessively high on the contrary, it becomes difficult to convey the components because of reduced flow velocity and the like.

Other Embodiments

FIGS. 48 to 58 show other embodiments applicable to each of the above-described first embodiment and the second embodiment.

FIG. 48A shows a variation of the component stopper 10 according to the first embodiment, and in order to prevent the outside air from entering through a gap between the under surface of the component stopper 10 and the base of the concave portion 8c during air suction to cause pressure loss or flow rate loss, the under surface of the component stopper 10 is provided with sealing material 51 so as to enclose the lower end aperture of the air flow port 10a, and this sealing material 51 is brought into contact with the base of the concave portion 8c. If resin material or the like having low frictional resistance is used as the sealing material 51, the rotational displacement of the component stopper 10 will not be hindered.

FIG. 48B shows a variation of the component stopper 30 according to the second embodiment, and in order to prevent the outside air from entering through a gap between the under surface of the component stopper 30 and the base of the concave portion 28c during air suction to cause pressure loss or flow rate loss, the under surface of the component stopper 30 is provided with sealing material 52 so as to enclose the lower end aperture of the air flow port 30a, and this sealing material 52 is brought into contact with the base of the concave portion 28c. If resin material or the like having low frictional resistance is used as the sealing material 52, the rotational displacement of the component stopper 30 will not be hindered.

FIG. 49A shows a variation of the component stopper 10 according to the first embodiment, and in order to prevent the outside air from entering through a gap between the top surface of the component stopper 10 and the under surface of the shutter 11 during air suction to cause pressure loss or flow rate loss, the top surface of the component stopper 10 is provided with sealing material 53 so as to enclose the top end aperture of the air flow port 10a and the air flow channel 10d, and this sealing material 53 is brought into contact with the under surface of the shutter 11. If resin material or the like having low frictional resistance is used as the sealing material 53, the rotational displacement of the component stopper 10 will not be hindered.

FIG. 49B shows a variation of the component stopper 30 according to the second embodiment, and in order to prevent the outside air from entering through a gap between the top surface of the component stopper 30 and the under surface of the movable shutter 31 during air suction to cause pressure loss or flow rate loss, the top surface of the component stopper 30 is provided with sealing material 54 so as to enclose the top end aperture of the air flow port 30a and the air flow channel 30d, and this sealing material 54 is brought into contact with the under surface of the movable shutter 31. If resin material or the like having low frictional resistance is used as the sealing material 54, the rotational displacement of the component stopper 30 will not be hindered.

FIG. 50A shows a variation of the component stopper 10 according to the first embodiment, and in order to prevent the outside air from entering through a gap between the top surface of the component stopper 10 and the under surface of the shutter 11 during air suction to cause pressure loss or flow rate loss, the top surface of the component stopper 10 is provided with a cover 55 so as to cover the top end aperture of the air flow port 10a and the air flow channel 10d. If a thin non-magnetic plate such as stainless steel or the like is used as the cover 55, the thickness dimension of the component stopper 10 will not be increased. Also, even if there may be a gap between the cover 55 and the shutter 11, the pressure loss and the flow rate loss can be precisely prevented.

FIG. 50B shows a variation of the component stopper 30 according to the second embodiment, and in order to prevent the outside air from entering through a gap between the top surface of the component stopper 30 and the under surface of the movable shutter 31 during air suction to cause pressure loss or flow rate loss, the top surface of the component stopper 30 is provided with a cover 56 so as to cover the top end aperture of the air flow port 30a and the air flow channel 30d. If a thin non-magnetic plate such as stainless steel or the like is used as the cover 56, the thickness dimension of the component stopper 30 will not be increased. Also, even if there may be a gap between the cover 56 and the movable shutter 31, the pressure loss and the flow rate loss can be precisely prevented.

FIGS. 51A and 51B show a variation of the component stopper 10 according to the first embodiment, and in order to reduce the pressure loss during air suction with the air flow path in the component stopper 10 as a simpler one, on the right side of the permanent magnet MG, there is formed one air flow port 10a having a semi-circular cross section, and the top portion of this air flow port 10a communicates to the air flow channel 10d.

FIGS. 52A and 52B show a variation of the component stopper 30 according to the second embodiment, and in order to reduce the pressure loss during air suction with the air flow path in the component stopper 30 as a simpler one, on the right side of the permanent magnet MG, there is formed one air flow port 30a having a semi-circular cross section, and the top portion of this air flow port 30a communicates to the air flow channel 30d.

FIG. 53A shows a variation of the component stopper 10 according to the first embodiment, and in order to improve a flow of air in the air flow path formed in the component stopper 10 during air suction, the cross-section area of the air flow port 10a1 is enlarged to reduce a difference in cross-section area between the air flow port 8d of the second component guide 8 and the air flow port 10a1 of the component stopper 10.

FIG. 53B shows a variation of the component stopper 30 according to the second embodiment, and in order to improve a flow of air in the air flow path formed in the component stopper 30 during air suction, the cross-section area of the air flow port 30a1 is enlarged to reduce a difference in cross-section area between the air flow port 28d of the second component guide 28 and the air flow port 30a1 of the component stopper 30.

FIG. 54A shows a variation of the component stopper 10 according to the first embodiment, and the attraction wall 10c of the component stopper 10 is provided with a protruded portion 10c1 capable of being inserted into the tip end portion of the component passage 8a in such a manner that the foremost electronic component EC can be attracted to and held by this protruded portion 10c1. If even when the component stopper 10 makes rotational displacement and the foremost electronic component EC is separated from the succeeding components, the tip end of the protruded portion 10c1 is completely kept not to slip out of the component passage 8a, it will be possible to support the entire under surface of the foremost electronic component EC, which has been separated, by the base of the component passage 8a with stability, and to make it difficult to disturb the posture of the foremost electronic component EC by the separating operation.

FIG. 54B shows a variation of the component stopper 30 according to the second embodiment, and the attraction wall 30c of the component stopper 30 is provided with a protruded portion 30c1 capable of being inserted into the tip end portion of the component passage 28a in such a manner that the foremost electronic component EC can be attracted to and held by this protruded portion 30c1. If even when the component stopper 30 makes rotational displacement and the foremost electronic component EC is separated from the succeeding components, the tip end of the protruded portion 30c1 is completely kept not to slip out of the component passage 28a, it will be possible to support the entire under surface of the foremost electronic component EC, which has been separated, by the base of the component passage 28a with stability, and to make it difficult to disturb the posture of the foremost electronic component EC by the separating operation.

FIG. 55A shows a variation of the rear-side component passage 6b according to the first embodiment, and in order to improve a flow of air in the component passage 6b, the air auxiliary passage 6c, its front-side component passage 8a and the air auxiliary passage 8b during air suction, there is formed an air intake vent 57 such as through hole at a place, which corresponds to the curved portion of the component passage 6b of the first cover 7. In this case, in order to prevent dust and the like from being sucked into the component passage 6b and the like from the intake vent 57 together with air, a filter may be arranged for the intake vent 57. Of path, the above-described intake vent 57 may be formed at a place which corresponds to the rear portion of the long-sideways portion of the component passage 6b of the first cover 7 or the rear portion of the air auxiliary passage 6c.

FIG. 55B shows a variation of the rear-side component passage 26b according to the second embodiment, and in order to improve a flow of air in the component passage 26b, the air auxiliary passage 26c, its front-side component passage 28a and the air auxiliary passage 28b during air suction, there is formed an air intake vent 58 such as through hole at a place, which corresponds to the curved portion of the component passage 26b of the first cover 27. In this case, in order to prevent dust and the like from being sucked into the component passage 26b and the like from the intake vent 58 together with air, a filter may be arranged for the intake vent 58. Of path, the above-described intake vent 58 may be formed at a place which corresponds to the rear portion of the long-sideways portion of the component passage 26b of the first cover 27 or the rear portion of the air auxiliary passage 26c.

FIG. 56A shows a variation of the rear-side component passage 6b according to the first embodiment, and in order to improve a flow of air in the component passage 6b, the air auxiliary passage 6c, its front-side component passage 8a and the air auxiliary passage 8b during air suction, behind the air auxiliary passage 6c, there is formed an air intake vent 59 for continuing to the air auxiliary passage 6c and whose end portion is opened to the open air. In this case, in order to prevent dust and the like from being sucked into the component passage 6b and the like from the intake vent 59 together with air, a filter 60 may be arranged at the open end of the intake vent 59.

FIG. 56B shows a variation of the rear-side component passage 26b according to the second embodiment, and in order to improve a flow of air in the component passage 26b, the air auxiliary passage 26c, its front-side component passage 28a and the air auxiliary passage 28b during air suction, behind the air auxiliary passage 26c, there is formed an air intake vent 61 for continuing to the air auxiliary passage 26c and whose end portion is opened to the open air. In this case, in order to prevent dust and the like from being sucked into the component passage 26b and the like from the intake vent 61 together with air, a filter 62 may be arranged at the open end of the intake vent 61.

Figure 57:
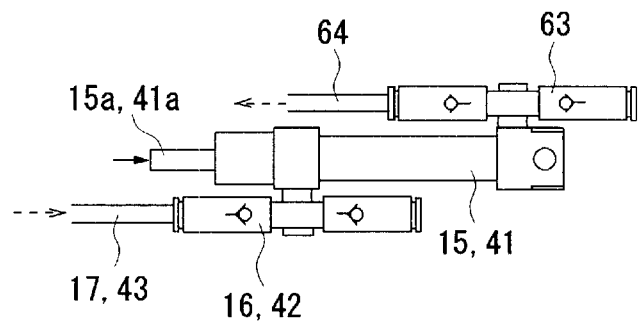
FIG. 57 is a view showing a variation of an air cylinder according to the first and second embodiments.
Figure 58:
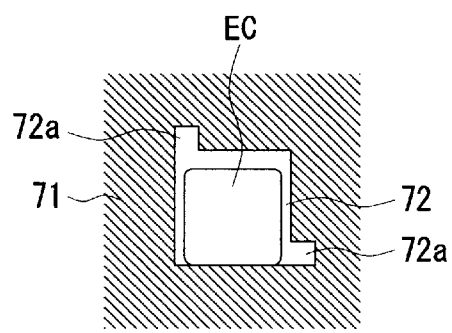
FIGS. 58A to 58C are views showing a variation of an air auxiliary passage according to the first and second embodiments respectively.
Figure 58:
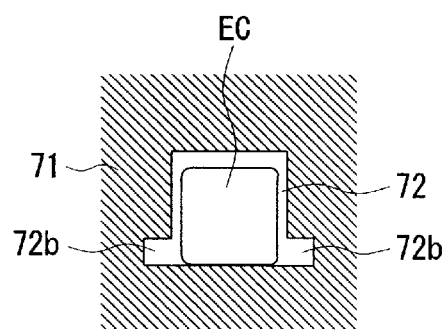
Figure 58:
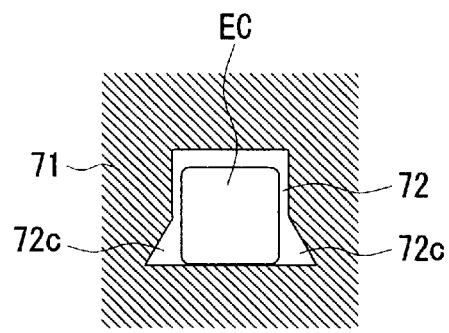

FIG. 57 shows a variation of the air cylinder 15, 41 according to the first or second embodiment, and to the other air supply/release port, which is not in use, there is connected a control valve 63 having a similar valve structure to the control valve 16, 42, and to the air release port of this control valve 63, one end of the air tube 64 is connected while the other end of this air tube 64 is connected to the intake vent 57, 58 shown in FIGS. 55A and 55B or the open end of the intake vent 59, 61 shown in FIGS. 56A and 56B. In the present embodiment, when air is sucked in the air suction port of one control valve 16, 42, air to be emitted from the air release port of the other control valve 64 can be sent into the component passage 6b, the air auxiliary passage 6c, or the component passage 26b and the air auxiliary passage 26c through the air tube 64. In other words, in the first or second embodiment, the components have been conveyed only through the use of the air suction force, but according to the present embodiment, the components can be conveyed through the use of air suction from the front side in combination with the air discharge from the rear side.

FIGS. 58A to 57C show a variation of the air auxiliary passage according to the first and second embodiments respectively, and in FIG. 58A, there are formed air auxiliary passages 72a in upper left and lower right, in the drawing, of the component passage 72 formed in the component guide 71. Also, in FIG. 58B, there are formed air auxiliary passages 72b in lower left and lower right, in the drawing, of the component passage 72 formed in the component guide 71. Further, in FIG. 58C, there are formed air auxiliary passages 72c having a triangular cross section in lower left and lower right, in the drawing, of the component passage 72 formed in the component guide 71.

Figure 59:
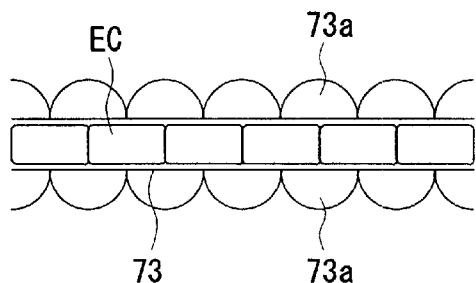
FIGS. 59A and 59B are views showing a variation of the air auxiliary passage according to the first and second embodiments respectively.
Figure 59:
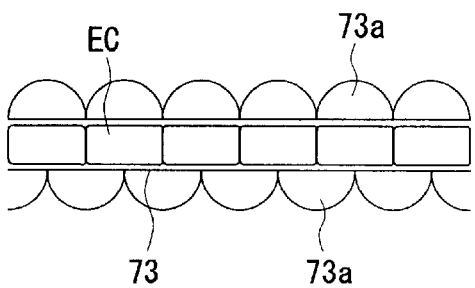

FIG. 59A and FIG. 59B show variations of the air auxiliary passage according to the first and second embodiments respectively, and in FIG. 59A, on both sides of the component passage 73, there are symmetrically formed air auxiliary passages 73a, each consisting of a series of substantially semi-circular concave portions. Also, in FIG. 59B, on both sides of the component passage 73, there are formed air auxiliary passages 73a each consisting of a series of substantially semi-circular concave portions in deviated relationship by the radius of the substantially semi-circular concave portion in the lengthwise direction. In the air auxiliary passage 73a shown in FIGS. 59A and 59B, the substantially semi-circular concave portions, which are adjacent each other, do not communicate to each other, but since it communicates to the component passage 73, each substantially semi-circular concave portion can sufficiently play its role as a passage of air.

The preferred embodiments described herein are illustrative, not restrictive. The scope of the present invention is defined by the accompanying claims. The present invention covers all variations within the scope of the claims.

What is claimed is:

1. An electronic component feeding apparatus, comprising:

a component passage for conveying electronic components in a ranging condition, said component passage having a component outlet port;

a shutter for opening and closing the component outlet port of the component passage;

a component stopper for stopping an advancement of the electronic components, said component stopper including an air suction path which leads to the component outlet port of the component passage;

an air suction unit having an air suction port;

an air tube for communicating an air suction force from the air suction port of the air suction unit to the air suction path of the component stopper; and a lever mechanism for operating the shutter and the air suction unit so that the air suction force acts in the air suction path of the component stopper through the air tube when the component outlet port of the component passage is closed by the shutter, and no air suction force acts in the air suction path of the component stopper through the air tube when the component outlet port of the component passage is opened by the shutter.

2. The electronic component feeding apparatus according to claim 1, wherein:

the component stopper is capable of moving between a component stop position and a component separating position apart from the same position; and the shutter is provided with a driving region for making the component stopper displace from the component stop position to the component separating position during an opening operation of the shutter, and making the component stopper displace from the component separating position to the component stop position during a closing operation of the shutter.

3. The electronic component feeding apparatus according to claim 1, further comprising:

a component guide including the component passage; and an air flow port formed on the component guide, said air flow port leading to the air suction path of the component stopper, said air flow port being connected to one end of the air tube.

4. The electronic component feeding apparatus according to claim 1, wherein a base end of the component passage is connected to a component taking-in mechanism arranged at a base of a storeroom capable of housing electronic components in a bulk state, and the component taking-in mechanism is capable of being operated by the lever mechanism.

5. The electronic component feeding apparatus according to claim 1, wherein the air suction unit is rotatably supported by a frame.

6. The electronic component feeding apparatus according to claim 1, wherein the lever mechanism operates the air suction unit so as to make the air suction force act in the air suction path of the component stopper while an operation of the lever mechanism is stopped.

7. The electronic component feeding apparatus according to claim 1, wherein the lever mechanism operates the shutter so as to make the shutter open or close while the lever mechanism is in operation.

8. The electronic component feeding apparatus according to claim 1, further comprising:

an intake vent provided at the rear of the component passage.

* * * * *